United States Patent
Hirobe

(10) Patent No.: US 11,126,373 B2
(45) Date of Patent: Sep. 21, 2021

(54) SEMICONDUCTOR DEVICE AND DATA PROCESSING SYSTEM

(71) Applicant: Renesas Electronics Corporation, Tokyo (JP)

(72) Inventor: Atsunori Hirobe, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 15/916,072

(22) Filed: Mar. 8, 2018

(65) Prior Publication Data
US 2018/0341431 A1    Nov. 29, 2018

(30) Foreign Application Priority Data
May 24, 2017  (JP) .............................. JP2017-103138

(51) Int. Cl.
*G06F 3/06*        (2006.01)
*G06F 13/40*       (2006.01)
(Continued)

(52) U.S. Cl.
CPC .......... *G06F 3/0659* (2013.01); *G06F 3/0604* (2013.01); *G06F 3/0679* (2013.01);
(Continued)

(58) Field of Classification Search
None
See application file for complete search history.

(56) References Cited

U.S. PATENT DOCUMENTS 7,203,770 B2 *  4/2007  Terai ...................... H04L 29/06
                                                     710/3
7,287,115 B2   10/2007  Otani et al.
(Continued)

FOREIGN PATENT DOCUMENTS

JP    2005-135182 A    5/2005
JP    2007-335809 A    12/2007
JP    2014-021925 A    2/2014

OTHER PUBLICATIONS

SK hynix Inc., Joonyoung Kim and YounsuKim, HBM: Memory Solution for Bandwidth-Hungry Processors, Aug. 2014, Internet <URL:https://ja.scribd.com/document/258652867/HC26-11-310-HBM-Bandwidth-Kim-Hynix-Hot-Chips-HBM-2014-v7>Date of retrievel: Feb. 20, 2017.
(Continued)

*Primary Examiner* — Charles Rones
*Assistant Examiner* — Ryan Dare
(74) *Attorney, Agent, or Firm* — McDermott Will & Emery LLP

(57) ABSTRACT

A technique is provided which can facilitate management of data in a memory device in a semiconductor device including the memory device and a data processing device. The semiconductor device includes a first external terminal, a second external terminal, a data processing device, and a memory device. The semiconductor device further includes a first bus coupled between the data processing device and the memory device, a second bus coupled between the data processing device and the second external terminal, a third bus coupled to the first external terminal, and a control circuit coupled to the first bus and the third bus. The control circuit has a management function of the memory device using the third bus.

20 Claims, 19 Drawing Sheets

(51) Int. Cl.
*G06F 13/16* (2006.01)
*H01L 25/065* (2006.01)
*G11C 5/02* (2006.01)
*G06F 12/0811* (2016.01)

(52) U.S. Cl.
CPC ...... *G06F 13/1684* (2013.01); *G06F 13/4004* (2013.01); *G11C 5/025* (2013.01); *H01L 25/0655* (2013.01); *G06F 12/0811* (2013.01)

(56) References Cited

U.S. PATENT DOCUMENTS

| | | | | |
|---|---|---|---|---|
| 8,724,423 | B1* | 5/2014 | Zhou | G11C 7/1075 |
| | | | | 365/189.02 |
| 8,732,356 | B2* | 5/2014 | Kabakura | G06F 3/0614 |
| | | | | 370/229 |
| 2008/0028104 | A1 | 1/2008 | Tsuneki | |
| 2008/0054493 | A1* | 3/2008 | Leddige | H01L 25/0657 |
| | | | | 257/786 |
| 2010/0044872 | A1* | 2/2010 | Park | H01L 23/5286 |
| | | | | 257/773 |
| 2011/0233755 | A1* | 9/2011 | Kim | H01L 23/3128 |
| | | | | 257/693 |
| 2011/0291679 | A1* | 12/2011 | Pagani | G01R 31/3172 |
| | | | | 324/750.01 |
| 2012/0254482 | A1* | 10/2012 | Kabakura | G06F 3/0683 |
| | | | | 710/38 |
| 2014/0237202 | A1* | 8/2014 | Yamamoto | G06F 3/0635 |
| | | | | 711/162 |
| 2015/0084166 | A1* | 3/2015 | Ide | H01L 23/481 |
| | | | | 257/621 |
| 2016/0163678 | A1* | 6/2016 | Park | H01L 25/0657 |
| | | | | 257/774 |
| 2017/0109042 | A1* | 4/2017 | Ke | G06F 12/0246 |

OTHER PUBLICATIONS

Japanese Notice of Reasons for Refusal issued in coresponding Japanese Patent Application No. 2017-103138, dated Sep. 1, 2020, with English translation.

* cited by examiner

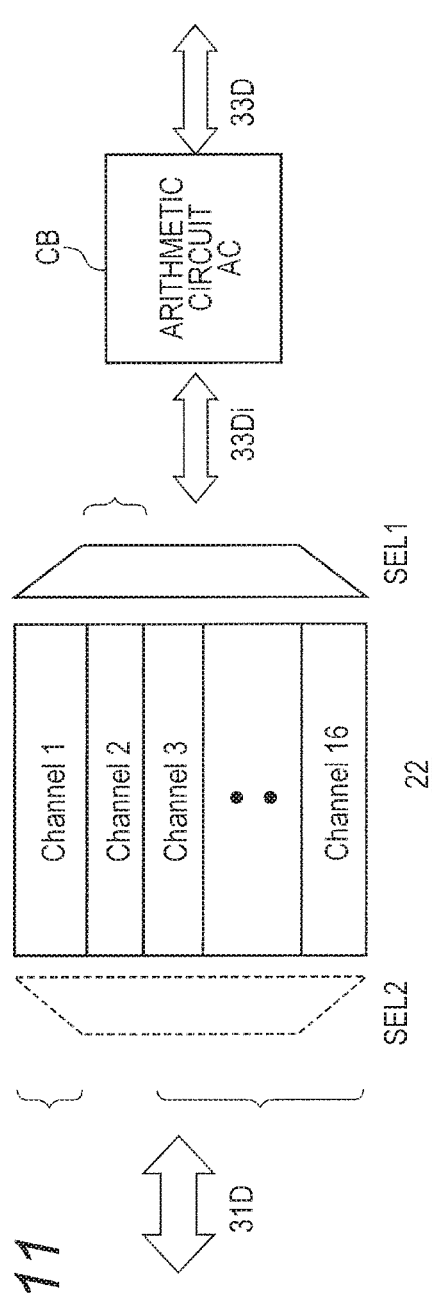
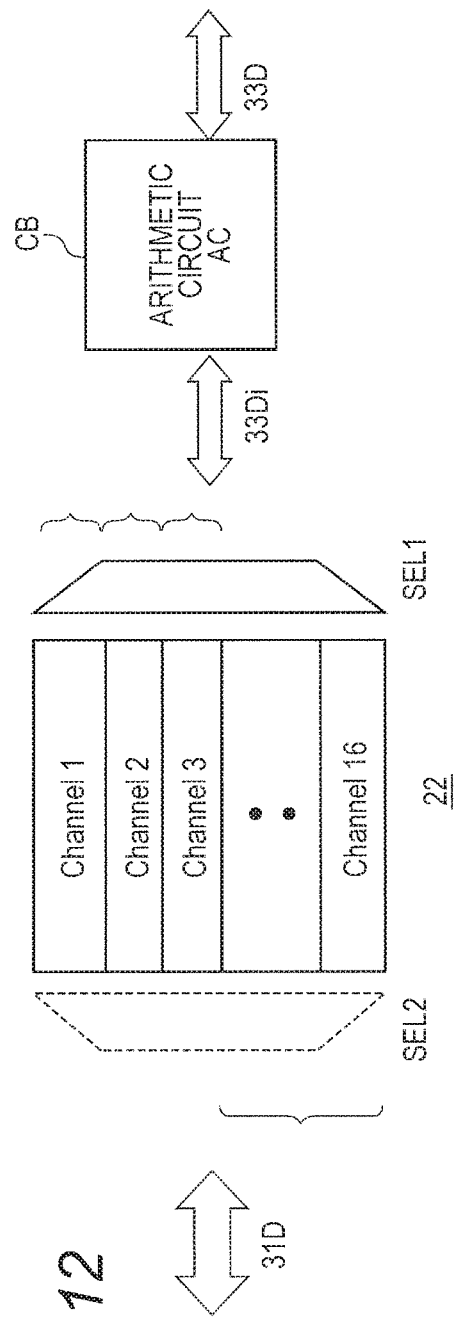

SEMICONDUCTOR DEVICE AND DATA PROCESSING SYSTEM

CROSS-REFERENCE TO RELATED APPLICATIONS

The disclosure of Japanese Patent Application No. 2017-103138 filed on May 24, 2017 including the specification, drawings and abstract is incorporated herein by reference in its entirety.

BACKGROUND

The present disclosure can be applied to a semiconductor device including a memory device and a data processing device, and a data processing system using the semiconductor device.

A 2.5 dimensional mounting technique and a 3-dimensional, mounting technique which seal a stacked memory using a through-silicon via (TSV) technique in the same semiconductor package as that of a data processing device are being developed.

For example, SK hynix Inc., Joonyoung Kim and YounsuKim, HBM: Memory Solution for Bandwidth-Hungry Processors, August 2014, Internet <URL: https://ja.scribd.com/document/258652867/HC26-11-310-HBM-Bandwidth-Kim-Hynix-Hot-Chips-HBM-2014-v7> Date of retrieval: Feb. 20, 2017 (Non-Patent Literature 1) discloses a configuration in which a host IF, a memory IF, and a Base Logic/IP Block are provided to a base die of a stacked memory of the 2.5-dimensional mounting technique. Further, Non-Patent Literature 1 discloses a configuration in which a DFT area, a TSV area, and PHY (an interface with SoC) are provided to a base die.

SUMMARY

An object of the present disclosure is to provide a technique that can facilitate management of data in a memory device in a semiconductor device including the memory device and a data processing device.

Other objects and novel features will become apparent from the description of the present specification and the accompanying drawings.

The following explains briefly an outline of a typical invention among the inventions disclosed in the present disclosure.

A semiconductor device includes a first external terminal, a second external terminal, a data processing device, and a memory device. The semiconductor device further includes a first bus coupled between the data processing device and the memory device, a second bus coupled between the data processing device and the second external terminal, a third bus coupled to the first external terminal, and a control circuit coupled to the first bus and the third bus. The control circuit has a management function of the memory device using the third bus.

According to the semiconductor device described above, it is possible to facilitate management of data in the memory.

BRIEF DESCRIPTION OF THE DRAWINGS

FIG. 11 is a diagram showing a modified example 2 of the memory device of FIG. 7.

FIG. 12 is a diagram showing another assignment example of a channel assignment of FIG. 11.

DETAILED DESCRIPTION

Figure 1:
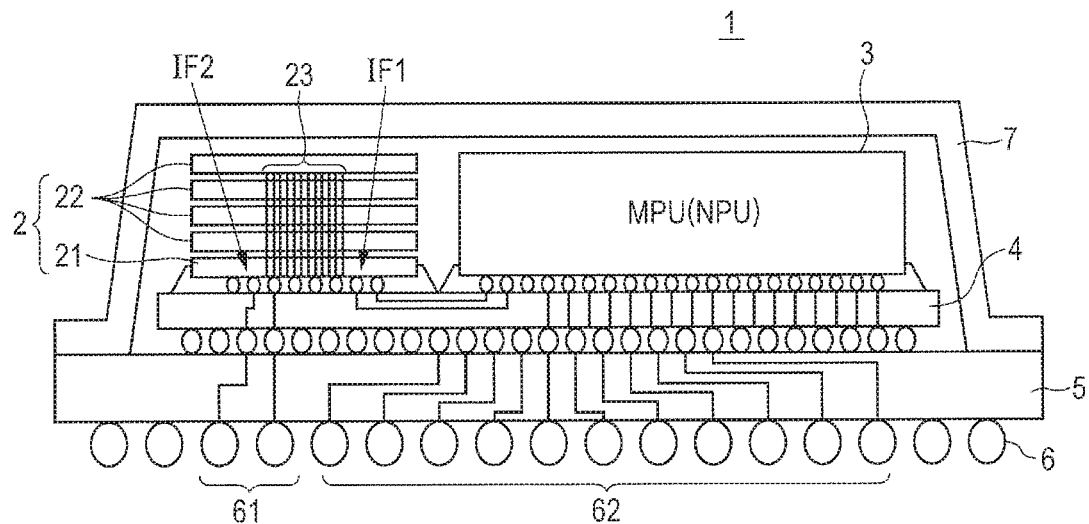
FIG. 1 is a conceptual cross-sectional view of a semiconductor device according to a first embodiment.

Hereinafter, embodiments, a comparative example, and modified examples will be described with reference to the drawings. However, in the description below, the same components are denoted by the same reference numerals and repeated description thereof may be omitted. The drawings may be schematically represented regarding the width, the thickness, the shape, and the like of each component as compared with the actual forms in order to make the description more accurate. However, the drawings are merely examples and do not limit the interpretation of the present invention.

First Embodiment

Figure 2:
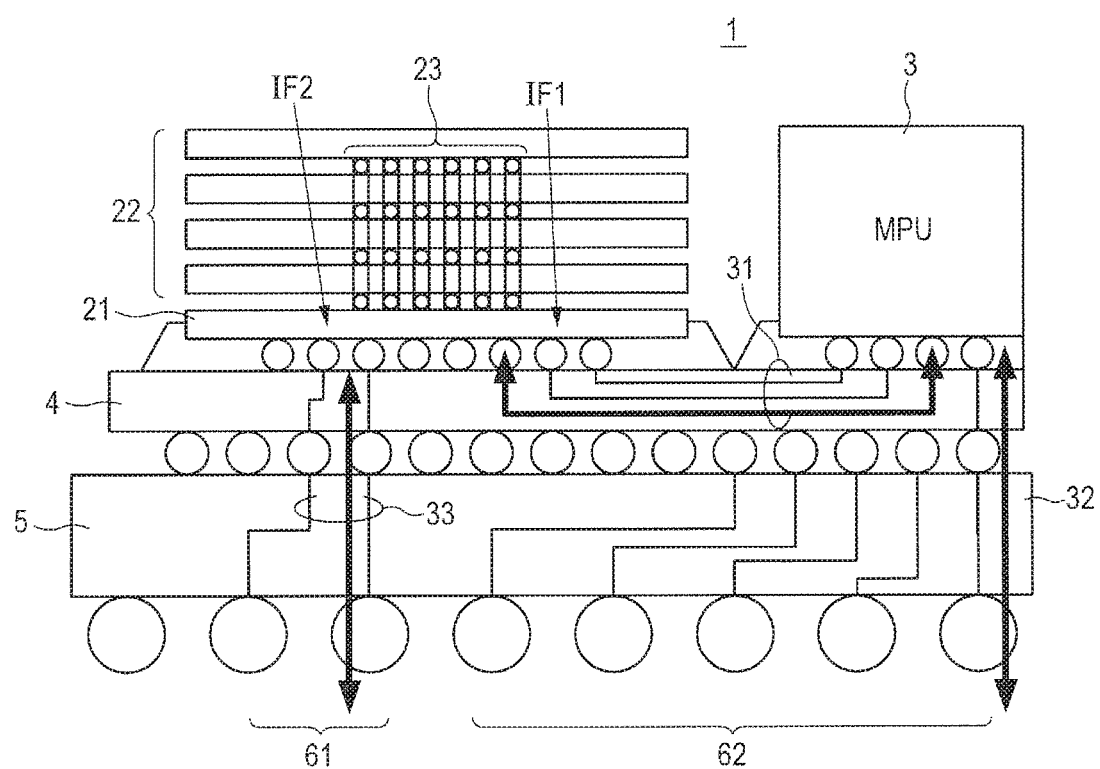
FIG. 2 is an enlarged diagram of the semiconductor device of FIG. 1.

FIG. 1 is a conceptual cross-sectional view of a semiconductor device according to a first embodiment. FIG. 2 shows an enlarged diagram of a part of the semiconductor device of FIG. 1.

The semiconductor device 1 has a memory device 2 and a data processing device (MPU (NPU)) 3, and is configured as one semiconductor package. The memory device 2 is composed of a base chip (base die) 21 and a semiconductor memory (a plurality of semiconductor memory chips) 22 stacked over the base chip 21. The base chip 21 and the plurality of semiconductor memory chips 22 are coupled by a coupling structure 23 that uses TSV (Si through electrode: through-silicon via) and metal electrodes (micro-bumps) such as solder. The base chip 21 and the data processing device 3 are coupled to a first substrate 4 such as a silicon interposer by, for example, metal electrodes (micro-bumps) such as solder. The first substrate 4 is coupled to a second substrate 5, which is used as a circuit substrate of a package, by, for example, metal electrodes (micro-bumps) such as solder. The second substrate 5 is provided with a plurality of ball electrodes (external terminals) 6 composed of metal electrodes such as solder. The second substrate 5 is provided with, for example, a cap 7 formed of metal of the like that covers memory device 2 and the data processing device 3 in order to seal the memory device 2 and the data processing device 3. The MPU (TCU) is a microprocessor (Micro Processor Unit) or a network processor (Networking Processing Unit).

Ball electrodes (external terminals) 6 provided to the second substrate 5 have a plurality of first external terminals 61 and a plurality of second external terminals 62. The plurality of first external electrodes 61 are coupled to a second interface unit IF2 of the base chip 21 through wirings in the first substrate 4 and the second substrate 5 and micro-bumps. The second external terminals 52 are coupled to the data processing device 3 through wirings in the first substrate 4 and the second substrate 5 and micro-bumps. As described later, the second external terminals 62 are provided to couple to a first system bus SBUS1, and the first external terminals 61 are provided to couple to a second system bus SBUS2 which is an auxiliary bus or an expansion bus.

The base chip 21 further has a first interface unit IF1 to the data processing device 3. The first interface unit IF1 is coupled to the data processing device 3 through wirings in the first substrate 4 and micro-bumps.

As shown in FIG. 2, the semiconductor device 1 is provided with a first bus (first signal path) 31 provided between the first interface unit IF1 and the data processing device 3, a second bus (second signal path) 32 provided between the data processing device 3 and the second external terminals 62, and a third bus (third signal path) 33 provided between the second interface unit IF2 and the first external terminals 61. In FIG. 2, arrows shown for the first bus 31, the second bus 32, and the third bus 33 are respectively drawn to illustratively represent the buses 31, 32, and 33 to facilitate understanding.

FIGS. 1 and 2 illustratively show coupling wiring between the first interface unit IF1 and the data processing device 3 as two or three coupling wirings. Further, FIGS. 1 and 2 illustratively show coupling wiring between the second interface unit IF2 and the second external terminals 62 as two wirings. The number of coupling wirings between the first interface unit IF1 and the data processing device 3 is assumed to be, for example, about 1000. The number of coupling wirings between the second interface unit IF2 and the second external terminals 62 is assumed to be, for example, 80 to 100. In other words, the number of wirings of the first bus 31 is greater than the number of wirings of the third bus 33, and the number of wirings of the second bus 32 is greater than the number of wirings of the third bus 33.

In FIGS. 1 and 2, the memory chip 22 may be, for example, an SDR (Single Data Rate) type DRAM (Dynamic Random Access Memory) or a DDR (Double Data Rate) type DRAM. Although four memory chips 22 are shown in this example, the number of memory chips may be one, or four or more memory chips may be stacked. Only one type of memory chips may be used, or a plurality of types of memory chips may be combined. The plurality of types of memory chips may be selected from a DRAM (dynamic random access memory), a static type RAM (random access memory), a non-volatile memory, and the like. The non-volatile memory can be selected from a ROM (read-only memory), a flash memory, and the like. The data processing device 3 can be a microprocessor (MPU), a network processor (NPU), a graphic processor (GPU), or the like.

Figure 4:
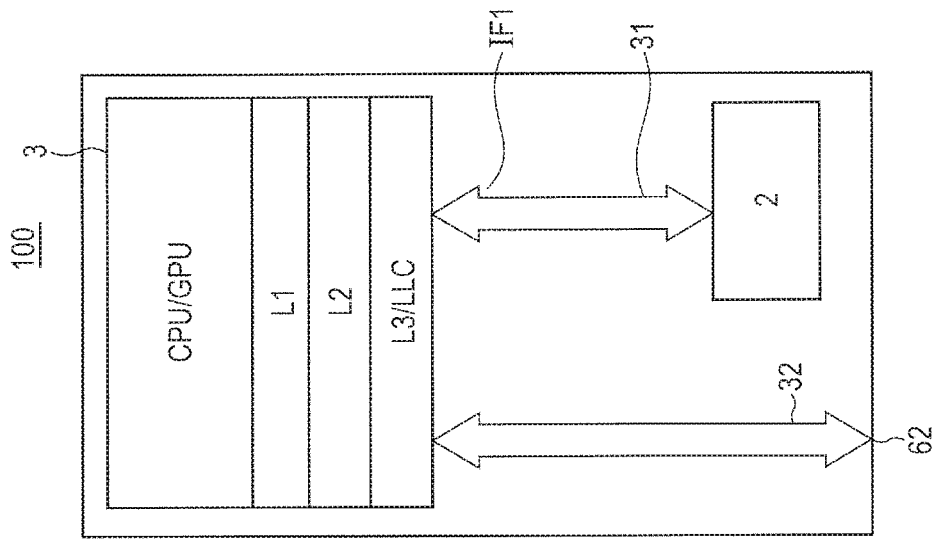
FIG. 4 is a conceptual block diagram of a semiconductor device according to a comparative example.
Figure 3:
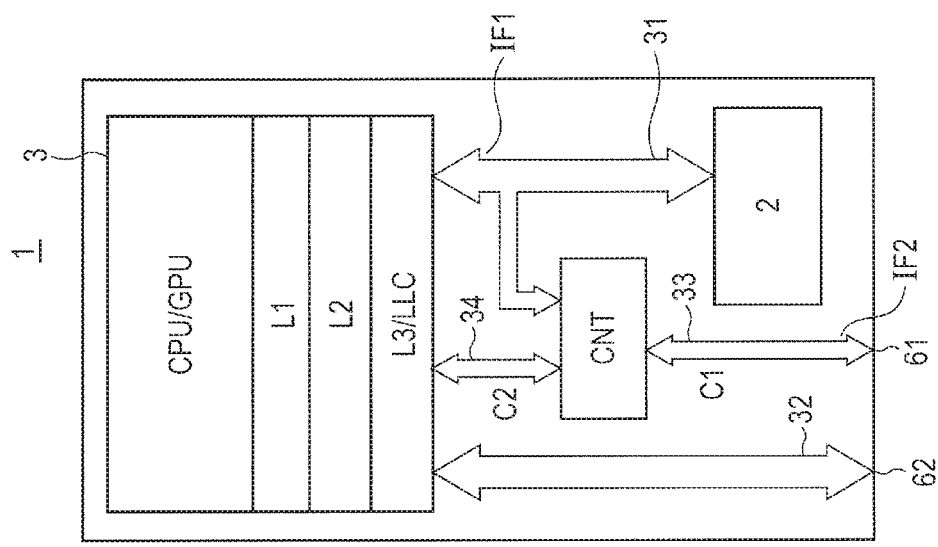
FIG. 3 is a conceptual block diagram of the semiconductor device according to the first embodiment.

FIG. 3 is a conceptual block diagram of the semiconductor device according to the first embodiment. FIG. 4 is a conceptual block diagram of a semiconductor device according to a comparative example.

As shown in FIG. 3, the semiconductor device 1 has the memory device 2, the data processing device 3, and a control circuit CNT. Although not particularly limited, the data processing device 3 includes a central processing unit or a graphic processor (CPU/GPU) and cache memories (L1, L2, and L3/LLC). In this example, the cache memories include a primary cache memory (level 1 cache) (L1), a secondary cache memory (level 2 cache) (L2), and a tertiary cache memory (level 3 cache or last level cache) (L3/LLC).

The semiconductor device 1 has the first bus (first signal path, memory bus) 31 provided between the memory device 2 and the data processing device 3, the second bus (second signal path) 32 provided between the data processing device 3 and the second external terminals 62, and the third bus (third signal path) 33 provided between the control circuit CNT and the first external terminals 61. The control circuit CNT is coupled to the first bus 31 and also coupled to a fourth bus (fourth signal path) 34 provided between the control circuit CNT and data processing device 3. Details of the control circuit CNT will be described later.

The first bus 31 is provided so that the data processing device 3 reads data from the memory device 2 and writes data to the memory device 2. The second bus 32 is provided to read and write data between the data processing device 3 and the outside of the semiconductor device 1. The third bus 33 is provided to transmit and receive data and first control information (control signal) between the control circuit CNT and the outside of the semiconductor device 1. The fourth bus 34 is provided to transmit and receive second control information (control signal) between the data processing device 3 and the control circuit CNT.

By configuring as described above, the memory device 2 shown in FIG. 3 has two access paths, which are a first access path where the data processing device 3 performs reading and writing through the first bus 31 and a second access path where reading and writing are performed by using the third bus 33, the control circuit CNT, and the first bus 31. As a result, the memory device 2 shown in FIG. 3 can perform management of storage content in the memory device 2 by using the second access path in addition to management of storage content in the memory device 2 by using the first access path.

FIG. 4 is a conceptual block diagram of a semiconductor device according to a comparative example. Regarding components of the semiconductor device 100 in FIG. 4 and components of the semiconductor device 1 in FIG. 3, components corresponding to each other are denoted by the same reference symbols. A point where the semiconductor device 100 in FIG. 4 is different from the semiconductor device 1 in FIG. 3 is that the semiconductor device 100 in FIG. 4 is not provided with the control circuit CNT, the third bus 33, and the fourth bus 34. Although the memory device 2 in the semiconductor device 1 has the first access path and the second access path as described above, the memory device 2 in the semiconductor device 100 has only the first access path. Therefore, to manage the storage content in the memory device 2 in the semiconductor device 100, there is no other way than use of the first access path by the data processing device 3 in the semiconductor device 100.

Figure 5:
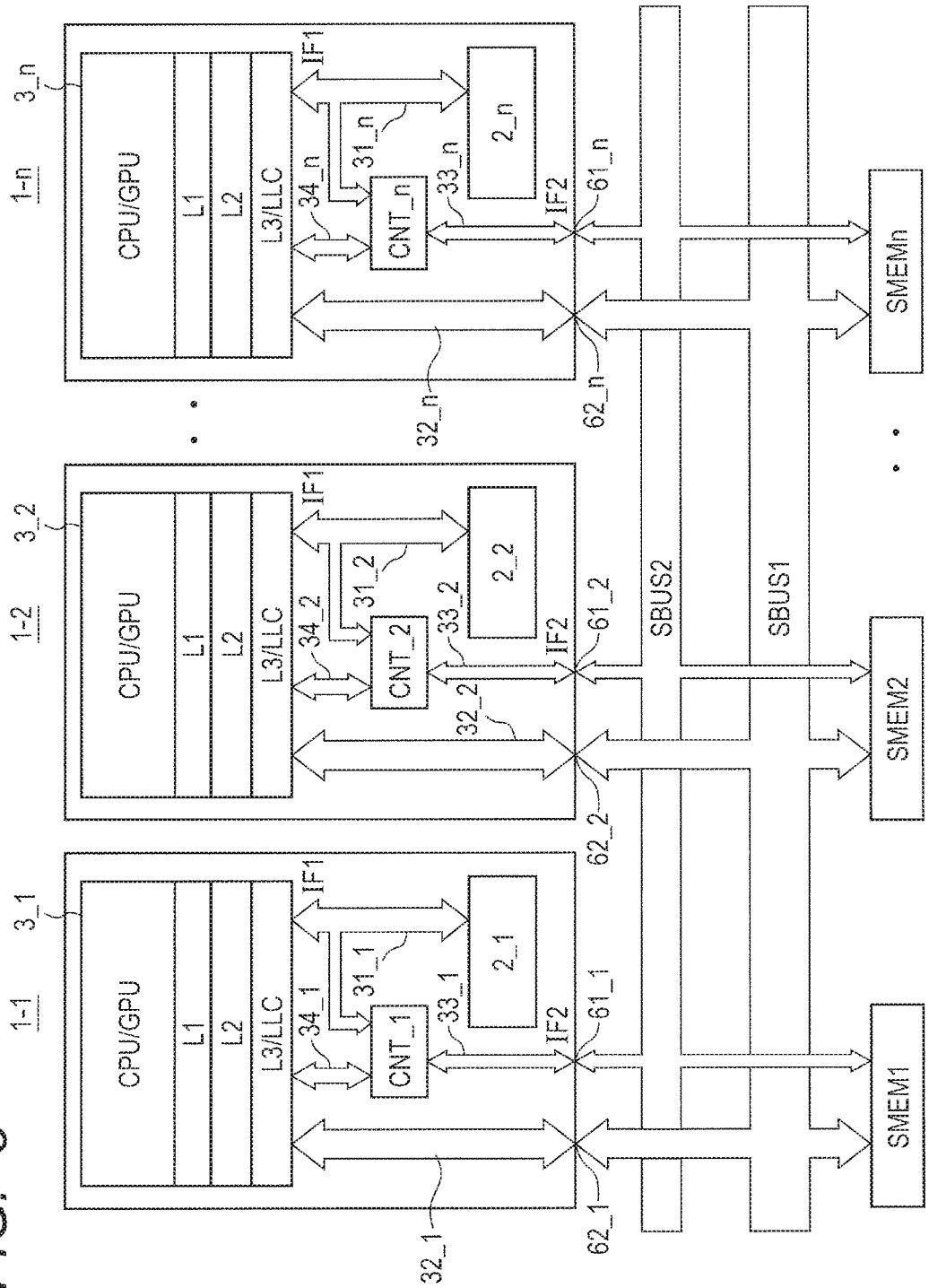
FIG. 5 is a conceptual configuration diagram of a data processing system according to the first embodiment.

FIG. 5 is a conceptual configuration diagram of a data processing system according to the first embodiment. FIG. 5 shows the data processing system including a plurality of semiconductor devices 1_1, 1_2, . . . , and 1_n. Each of the semiconductor devices 1_1, 1_2, . . . , and 1_n corresponds to the semiconductor device 1 in FIG. 3. In FIG. 5, components (X=2, 3, 31, 32, 33, 34, 61, 62, and CNT) in the semiconductor device 1 shown in FIG. 3 are represented by using reference symbols such as X_1, X_2, . . . , and X_n corresponding to the semiconductor devices 1_1, 1_2, . . . , and 1_n, so that correspondence relationship between the components and the semiconductor devices are shown. However, regarding the first interface unit IF1 and the second interface unit IF2, the same reference symbols are used in each of the semiconductor devices 1_1, 1_2, . . . , and 1_n.

The second buses 32_1, 32_2, . . . , and 32_n of the semiconductor devices 1_1, 1_2, . . . , and 1_n are coupled to the first system bus SBUS1 through the second external terminals 62_1, 62_2, . . . , and 62_n, respectively. The third buses 33_1, 33_2, . . . , and 33_n of the semiconductor devices 1_1, 1_2, . . . , and 1_n are coupled to a newly-provided or added second system bus SBUS2 through the first external terminals 61_1, 61_2, . . . , and 61_n, respectively. The second system bus SBUS2 is mainly used to manage storage contents of the memory devices 2_1, 2_2, . . . , and 2_n provided in the semiconductor devices 1_1, 1_2, . . . , and 1_n. Each of the first system bus SBUS1 and the second system bus SBUS2 is coupled with system memories SMEM1, SMEM2, . . . , and SMEMn. An example of two-port memory having two input/output ports is shown for each of the system memories SMEM1, SMEM2, . . . , and SMEMn. As shown in FIG. 5, in each of the system memories SMEM1, SMEM2, . . . , and SMEMn, one port is coupled to the first system bus SBUS1 and the other port is coupled to the second system bus SBUS2. Although an example is shown in which a plurality of system memories are provided in this example, the number of system memories may be one.

For example, the second system bus SBUS2 can be used as follows:

(1) Single write 1: content of the memory device 2_1 of the semiconductor device 1_1 can be copied to the memory device 2_2 of the semiconductor device 1_2 by using the second system bus SBUS2.

(2) Multiple writes 1: content of the memory device 2_1 of the semiconductor device 1_1 can be copied to the memory device 2_2 of the semiconductor device 1_2 and the memory device 2_n of the semiconductor device 1_n by using the second system bus SBUS2.

(3) Single write 2: content of the memory device 2_1 of the semiconductor device 1_1 can be copied to a system memory (SMEM1, SMEM2, . . . , SMEMn) by using the second system bus SBUS2.

(4) Multiple writes 2: content of the memory device 2_1 of the semiconductor device 1_1 can be copied to the memory device 2_2 of the semiconductor device 1_2 and a system memory (SMEM1, SMEM2, . . . , or SMEMn) by using the second system bus SBUS2).

(5) Single write 3: content of a system memory (SMEM1, SMEM2, . . . , or SMEMn) can be copied to the memory device 2_1 of the semiconductor device 1_1 by using the second system bus SBUS2.

(6) Multiple writes 3: content of a system memory (SMEM1, SMEM2, . . . , or SMEMn) can be copied to the memory device 2_1 of the semiconductor device 1_1 and the memory device 2_2 of the semiconductor device 1_2 by using the second system bus SBUS2.

By the configuration described above, it is possible to manage contents of the system memories SMEM1, SMEM2, . . . , and SMEMn and contents of the memory devices 2_1, 2_2, . . . , and 2_n in the semiconductor devices 1_1, 1_2, . . . , and 1_n by using the second system bus SBUS2 without using the first system bus SBUS1. In other words, it is possible to manage contents of the system memories SMEM1, SMEM2, . . . , and SEMn and contents of the memory devices 2_1, 2_2, . . . , and 2_n in the semiconductor devices 1_1, 1_2, . . . , and 1_n by using the third buses 33_1, 33_2, . . . , and 33_n and the second system bus SBUS2 without limiting use of the second buses 32_1, 32_2, . . . , and 32_n and the first system bus SBUS1 by the data processing devices 3_1, 3_2, . . . , and 3_n.

It is also possible to manage contents of the system memories SMEM1, SMEM2, . . . , and SMEMn and contents of the memory devices 2_1, 2_2, . . . , and 2_n in the semiconductor devices 1_1, 1_2, . . . , and 1_n by using both a set of the second buses 32_1, 32_2, . . . , and 32_n and the first system bus SBUS1 and a set of the third buses 33_1, 33_2, . . . , and 33_n and the second system bus SBUS2.

Figure 6:
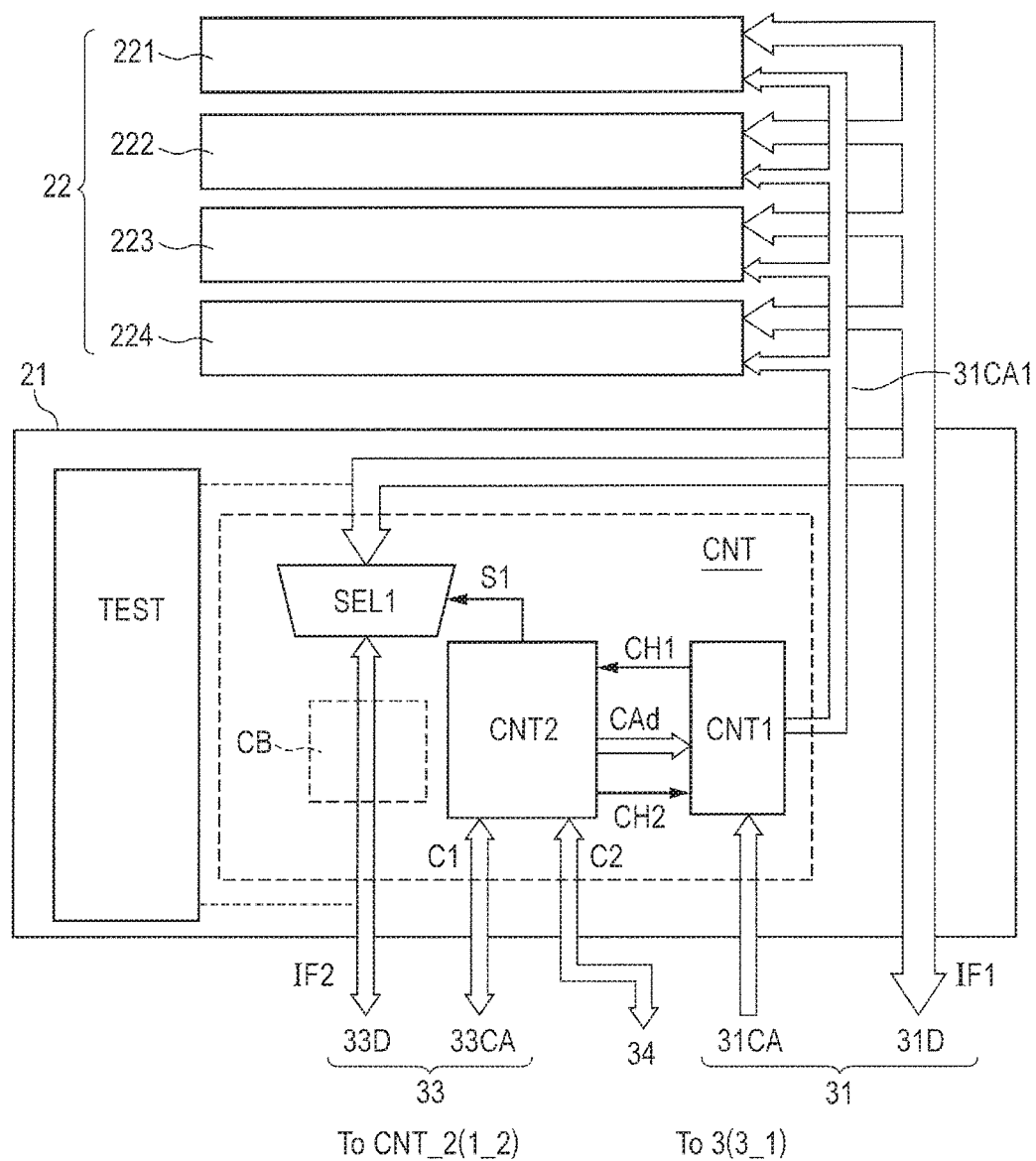
FIG. 6 is a block diagram of a memory device according to the first embodiment.

FIG. 6 shows a block diagram of a memory device according to the first embodiment. FIG. 6 shows an example of a block diagram of the memory device 2 including the control circuit CNT of the semiconductor device 1 of FIG. 3. The memory device 3 has the base chip 21 and a plurality of stacked memory chips 22 (221, 222, 223, and 224). The control circuit CNT is provided in the base chip 21. The base chip 21 is coupled with the first bus 31, the third bus 33, and the fourth bus 34.

The first bus 31 has a first data bus 31D through which data is supplied and a first control bus 31CA through which a command (CMD), an address (ADD), and the like are supplied. As shown in FIG. 3 or 5, the first bus 31 is coupled to the data processing device 3 (3_1) in the same semiconductor device 1 (1_1).

The third bus 33 has a third data bus 33D through which data is supplied and a third control bus 33CA through which a control signal C1 including a command (CMD), an address (ADD), and the like is supplied. As shown in FIG. 5, the third bus 33 is coupled to the second system bus SBUS2 when a data system is configured. The second system bus SBUS2 is coupled to, for example, control circuits (CNT_2, CNT_n) in other semiconductor devices (1_2, 1_n) different from the semiconductor device 1 (1_1). FIG. 6 illustratively shows the control circuit (CNT_2) in a different semiconductor device (1_2) as a coupling destination of the third bus 33 in order to avoid complexity of the drawing. In other words, the control circuit (CNT_2) in the different semiconductor device (1_2) is shown as the reference symbol CNT_2 (1_2).

The fourth bus 34 is a bus through which a control signal C2 including command (CMD), an address (ADD), and the like is supplied. As shown in FIG. 3 or 5, the fourth bus 34 is coupled to the data processing device 3 (3_1) in the same semiconductor device 1 (1_1).

The base chip 21 includes the control circuit CNT and a test circuit TEST. The control circuit CNT further includes a first control circuit CNT1 coupled to the first control bus 31CA, a second control circuit CNT2 coupled to the third control bus 33CA and the fourth bus 34, and a selection circuit SEL1.

The first control circuit CNT1 is supplied with a command (CMD), an address (ADD), and the like from the first control bus 31CA, decodes a part of the address (ADD), and generates a channel selection signal. The first control circuit CNT1 supplies the command (CMD), the channel selection signal, and a remaining part of the address (ADD) to a plurality of memory chips 22 (221, 222, 223, and 224) through a control bus 31CA1. In other words, the first control circuit CNT1 has a function of memory controller and has a channel selection function of an input/output channel of a plurality of memory chips 22 (221, 222, 223, and 224). For example, each of the four memory chips 221, 222, 223, and 224 has four channels as input/output channels, and the entire memory device 2 has 16 channels. In this case, the first control circuit CNT1 forms a channel selection signal for selecting one or a plurality of input/output channels used to read data or write data according to a command (CMD) on the basis of the command (CMD) and an address (ADD), and outputs the channel selection signal to the control bus 31CA1 along with the command (CMD) and the address (ADD). The four memory chips 221, 222, 223, and 224 bring one or a plurality of input/output channels used to read data or write data into a selected state according to the channel selection signal, the command (CMD), and the address (ADD) received from the control bus 31CA1. When the command (CMD) is to read data, data read from a memory cell corresponding to an address (ADD) of a channel selected by the channel selection signal is supplied to the data processing device 3 (3-1) through the data bus 31D. When the command (CMD) is to write data, data outputted from the data processing device 3 (3-1) to the data bus 31D is written to a memory cell corresponding to an address (ADD) of a channel selected by the channel selection signal. The command (CMD) includes a refresh command.

The first control circuit CNT1 also has a function to output first channel information CH1 related to a usage state (read, write, or refresh) of a channel. The first control circuit CNT1 also has a function to input second channel information CH2 related to channel request information outputted from the second control circuit CNT2 and output a channel selection signal according to the second channel information CH2 in the same manner as described above.

The second control circuit CNT2 receives a control signal C1 supplied from the fourth bus 34, a control signal C2 supplied from the third control bus 33CA, and a channel information CH from first control circuit CNT1. The second control circuit CNT2 generates a command/address CAd and a selection signal S1 on the basis of the control signal C1, the control signal C2, and the channel information CH. The command/address CAd is outputted to the first control circuit CNT1. On the other hand, the selection signal S1 is outputted to the selection circuit SEL1. The selection circuit SEL1 controls coupling between the first data bus 31D and the third data bus 33D on the basis of the selection signal S1. For example, a case is assumed where, in a situation in which the data processing device 3 (3_1) in the semiconductor device 1 (1-1) uses channels 1 to 14 to read data or write data, the control signal C1 or the control signal C2 requests use of, for example, channels 14 to 16. In this case, the channels 1 to 14 are busy channels, and it is known that the channels 1 to 14 are being used by the data processing device 3 (3_1) from the channel information CH1. Therefore, the second control circuit CNT2 generates the selection signal S1 and controls the selection circuit SEL1 so as to select data lines of one or a plurality of the unused channels 15 and 16 other than the competing channel 14. In other words, the second control circuit CNT2 has a function of a channel arbitration circuit. Therefore, data lines corresponding to the selected channels in the unused channels 15 and 16 in the first data bus 31D and data lines in the third data bus 33D are selectively coupled by the selection circuit SEL1 on the basis of the selection signal S1. Further, the second control circuit CNT2 generates channel request information related to the channels 15 and 16 as second channel information CH2 and outputs the second channel information CH2 to the first control circuit. CNT1 in order to select the unused channels 15 and 16. Thereby, the first control circuit CNT1 outputs the channel selection signal corresponding to the channels 15 and 16 and the command/address CAd to the control bus 31CA1 on the basis of the command/address CAd and the second channel information CH2 from the second control circuit CNT2.

Thereby, it is possible to perform a selection operation of channels of the memory device 2 according to the control signal C1 and the control signal C2 and a writing operation and a reading operation of data to and from the selected channels.

When the control signal C1 and the control signal C2 are inputted at substantially the same time and use of the same channel is requested by the control signal C1 and the control signal C2, it is preferable to determine a priority order whether the control signal C1 is prioritized or the control signal C2 is prioritized by using a function of an operating system (OS) of the data processing device 3 (3_1).

In FIG. 6, the test circuit TEST indicates a memory BIST (built-in self test) circuit provided to test or examine the memory device 22. The test circuit TEST can be coupled between the first bus 31 and the third bus 33 (the first external terminals 61). To avoid complexity of the drawing, FIG. 6 illustratively shows only the coupling between the first data bus 31D and the third data bus 33D for the test circuit TEST. In FIG. 6, although not particularly limited, a cache memory and an arithmetic circuit can be provided in the third data bus 33D as a circuit block CB.

Figure 7:
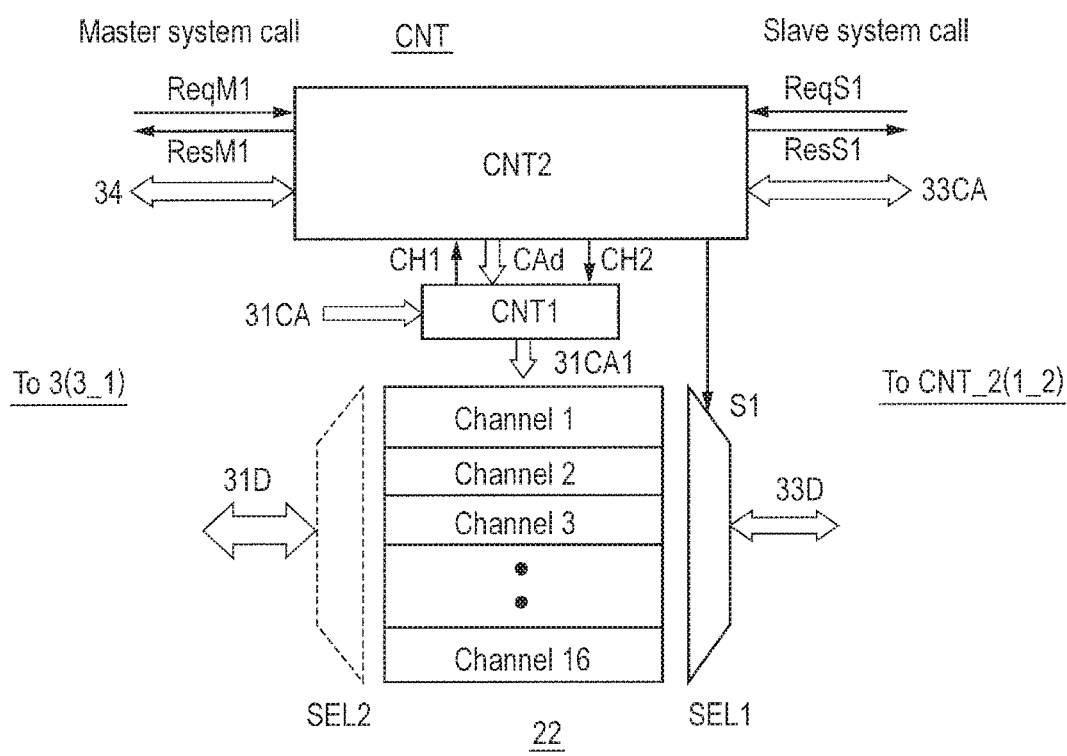
FIG. 7 is a diagram for conceptually explaining an operation of a control circuit according to the first embodiment.

FIG. 7 is a diagram for conceptually explaining an operation of the control circuit according to the first embodiment. In FIG. 7, the memory chip 22 includes the channels 1 to 16, and it is described that the channels 1 to 16 are selected by the selection circuit SEL1, the first control circuit CNT1, and the second control circuit CNT2. In FIG. 7, the left side shows a coupling relationship with the data processing device 3 (3_1) in the same semiconductor device 1 (1_1) of FIG. 3 or FIG. 5, and the right side shows a coupling relationship with the control circuits (CNT_2, CNT_n) in other semiconductor devices (1_2, 1_n) different from the semiconductor device 1 (1_1) To avoid complexity, FIG. 7 illustratively shows the control circuit CNT_2 in the semiconductor device 1_2 as the reference symbol CNT_2 (1_2). In the description below, the data processing device 3 (3_1) in the semiconductor device 1 (1-1) is defined as a master side and the data processing device 3_2 coupled to the control circuit (CNT_2) in the semiconductor device (1_2) is defined as a slave side.

As described in FIG. 6, the first control circuit CNT1 outputs the channel selection signal to a third control bus 33CA1 on the basis of the command/address CAd and the channel information CH2. Thereby, one or a plurality of channels in the channels 1 to 16 are selected. The selection circuit SEL1 selects unused channels by the master side data processing device 3 (3_1) by the selection signal S1 from the second control circuit CNT2 and performs an operation to couple to the third bus 33D. On the other hand, a selection circuit SEL2 is a configuration provided to schematically represent selection of one or a plurality of channels used by the master side data processing device 3 (3_1) for ease of understanding and is coupled to the data processing device 3 (3_1) through the first data bus 31D.

The second control circuit CNT2 is coupled to the master side data processing device 3 (3_1) in the semiconductor device 1 (1-1) of FIG. 3 or FIG. 5 through the fourth bus 34. The second control circuit CNT2 is further coupled to the third control bus 33CA. As shown in FIG. 5, the third control bus 33CA is coupled to the control circuit CNT_2 and the slave side data processing device 3_2 in a different semiconductor device 1-2 through the second system bus SBUS2.

Hereinafter, an example of an input/output control signal for the second control circuit CNT2 will be described.

The second control circuit CNT2 transmits and receives a master side system call (Master system call) to and from the master side data processing device 3 (3_1) through the fourth bus 34. The second control circuit CN2 transmits and receives a slave side system call (Slave system call) to and from the control circuit CNT_2 or the data processing device 3_2 in the slave side semiconductor device 1_2 through the third control bus 33CA and the second system bus SBUS2.

The master side system call (Master system call) includes a master side request ReqM1 and a master side response ResM1 which is a response signal to the master side request ReqM1. The slave side system call (Slave system call) includes a slave side request ReqS1 and a slave side response ResS1 which is a response signal to the slave side request. ReqS1.

The master side request ReqM1 includes, for example, transfer destination address information, transfer source address information, memory control information, busy channel information, and access block information. The master side response ResM1 includes, for example, request source address information, busy channel information, and access block information. The slave side request ReqS1 includes, for example, transfer destination address information, transfer source address information, memory control information, busy channel information, and access block information. The slave side response ResS1 includes, for example, request source address information, busy channel information, access block information, and the like.

The second control circuit CNT2 receives the master side request ReqM1 from the master side data processing device 3 (3_1) and transmits the master side response ResM1 to the master side data processing device 3 (3_1) as a response to the master side request ReqM1. Thereby, the second control circuit CNT2 outputs the control signal C1 to the third control bus 33CA or outputs the control signal C2 to the fourth bus 34. The control signal C1 is supplied to the control circuit CNT_2 in the slave side semiconductor device 1_2 through the second system bus SBUS2, and the memory device 2_2 and desired system memories (SMEM1, SMEM2, . . . , and/or SMEMn) are accessed. On the other hand, the control signal C2 is supplied from the master side data processing device 3 (3_1) to the first system bus SBUS1 through the second bus 32_1, and the memory device 2_2 is accessed by the data processing device 3_2 in the slave side semiconductor device 1_2 or desired system memories (SMEM1, SMEM2, . . . , and/or SMEMn) are accessed.

The second control circuit CNT2 receives the slave side request ReqS1 from the control circuit CNT_2 in the slave side semiconductor device 1_2 and transmits the slave side response ResS1 to the control circuit CNT2 in the slave side semiconductor device 1_2 as a response to the slave side request ReqS1. Thereby, in the same manner as described above, the control circuit CNT_2 in the semiconductor device 1_2 outputs the control signal C1 to the third control bus 33CA in the semiconductor device 1_2 or outputs the control signal C2 to the fourth bus 34 in the semiconductor device 1_2.

The control signal C1 is supplied to the control circuit CNT_1 in the master side semiconductor device 1-1 through the second system bus SBUS2, and the memory device 2_1 and desired system memories (SMEM1, SMEM2, . . . , and/or SMEMn) are accessed. The control signal C2 is supplied from the slave side data processing device 3_2 to the first system bus SBUS1 through the second bus 32_2, and the memory device 2_1 is accessed by the data processing device 3_1 in the master side semiconductor device 1_1 or desired system memories (SMEM1, SMEM2, . . . , and/or SMEMn) are accessed. It is possible to determine whether or not to use only the control signal C1, only the control signal C2, or both the control signals C1 and C2 depending on a function of an operating system (OS) of the data processing device 3_1.

Figure 8:
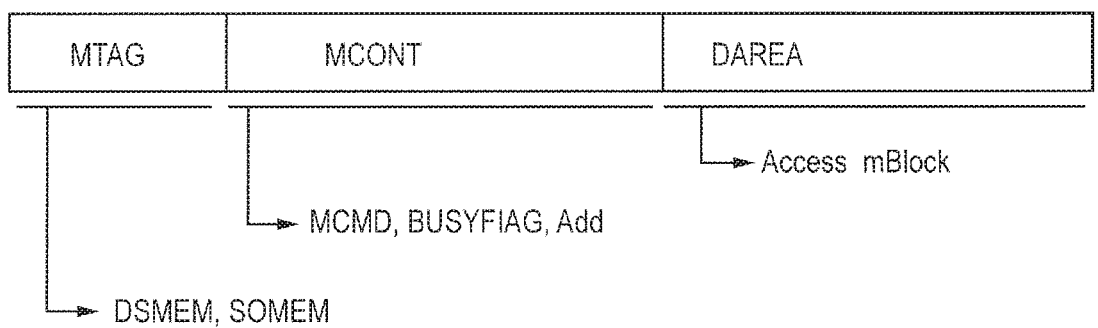
FIG. 8 is a diagram showing an example of a format of control signals C1 and C2.

FIG. 8 is a diagram showing an example of a format of the control signals C1 and C2. The control signals C1 and C2 include a memory tag field MTAG, a memory function control field MCONT, and a data area field DAREA.

The memory tag field MTAG includes a transfer destination memory specification field DSMEM and a transfer source memory specification field SOMEM. In the transfer destination memory specification field DSMEM, it is possible to specify one or a plurality of memory devices selected from the memory devices (2_1, 2_2, . . . , 2_n, SMEM1, SMEM2, . . . , and SMEMn) as transfer destinations. In the transfer source memory specification field SOMEM, it is possible to specify one memory device selected from the memory devices (2_1, 2_2, . . . , 2_n, SMEM1, SMEM2, . . . , and SMEMn) as a transfer source. However, one or a plurality of memory devices specified in the transfer destination memory specification field DSMEM are different from the one memory device selected in the transfer source memory specification field SOMEM, and overlapping specification is not permitted.

The memory function control field MCONT includes a memory command field MCMD, a busy channel information flag field BUSYFLAG, and an address field Add. In the memory command field MCMD, it is possible to specify a read command or a write command for one or a plurality of memory devices (2_1, 2_2, . . . , 2_n, SMEM1, SMEM2, . . . , and/or SMEMn) specified in the transfer destination memory specification field DSMEM. In the busy channel information flag field BUSYFLAG, it is possible to specify a serial number of a channel that is currently used. In the address field Add, it is possible to specify a transfer destination address range for each of one or a plurality of memory devices (2_1, 2_2, . . . , 2_n, SMEM1, SMEM2, . . . , and/or SMEMn) specified in the transfer destination memory specification field DSMEM. A range of transfer destination memory address can be specified by a range using a row address (x1, x2) and a column address (y1, y2), such as, for example, (x1, y1)-(x2, y2). The command/address CAd described in FIGS. 6 and 7 is generated from the memory command field MCMD and the address field Add.

In the data area field DAREA, it is possible to specify a range of a transfer source memory address (Access mBloc) in a transfer source memory device specified in the transfer source memory specification field SOMEM. A range of the transfer source memory address can be specified by a range using a row address (x1, x2) and a column address (y1, y2), such as, for example, (x1, y1)-(x2, y2).

Therefore, it is possible to perform an operation of memory management (copy or coherent management) by specifying, for example, the above format as the control signal C1 as described below.

Specification Example (1)

Single Write 1 (Memory Device 2_1→Memory Device 2_2)

The memory device 2_2 is specified in the transfer destination memory specification field DSMEM, the memory device 2_1 is specified in the transfer source memory specification field SOMEM, and a write command is specified in the memory command field MCMD. Further, a desired address range is specified in the data area field DAREA and the address field Add. In this case, data of the address range specified in the data area field DAREA of the memory device 2_1 is supplied to the control circuit CNT2 in the memory device 2_2 through the third data bus 33D and the second system bus SBUS2 and written (copied) to the address range of the memory device 2_2 specified in the address field Add. In this case, it is known that the transfer source memory specification field SOMEM is the memory device 2_1 of the master side semiconductor device 1_1, so that it is possible to omit the specification of the transfer source memory specification field SOMEM.

Specification Example (2)

Multiple Writes 1 (Memory Device 2_1→Memory Device 2_2, 2_n)

The memory devices 2_2 and 2_n are specified in the transfer destination memory specification field DSMEM, the memory device 2_1 is specified in the transfer source memory specification field SOMEM, and a write command is specified in the memory command field MCMD. Further, a desired address range is specified in the data area field DAREA and the address field Add. In this case, data of the address range specified in the data area field DAREA of the memory device 2_1 is supplied to the control circuits CNT2 in the memory devices 2_2 and 2_n through the third data bus 33D and the second system bus SBUS2 and written (copied) to the address ranges of the memory devices 2_2 and 2_n specified in the address field Add. In this case, it is known that the transfer source memory specification field SOMEM is the memory device 2_1 of the master side semiconductor device 1_1, so that it is possible to omit the specification of the transfer source memory specification field SOMEM.

When the memory devices 2_2, . . . , and 2_n are specified in the transfer destination memory specification field DSMEM, data of the address range specified in the data area field DAREA of the memory device 2_1 is written to all the memory devices (2_2, . . . , and 2_n) other than the memory device 2_1.

Specification Example (3)

Single Write 2 (Memory Device 2_1→System Memory SMEM1)

The system memory SMEM1 is specified in the transfer destination memory specification field DSMEM, the memory device 2_1 is specified in the transfer source memory specification field SOMEM, and a read command is specified in the memory command field MCMD. Further, a desired address range is specified in the data area field DAREA and the address field Add. In this case, data of the address range specified in the data area field DAREA of the memory device 2_1 is written (copied) to the address range of the system memory SMEM1 specified in the address field Add through the third data bus 33D and the second system bus SBUS2 and. In this case, it is known that the transfer source memory specification field SOMEM is the memory device 2_1 of the master side semiconductor device 1_1, so that it is possible to omit the specification of the transfer source memory specification field SOMEM.

Specification Example (4)

Multiple Writes 2 (Memory Device 2_1→Memory Device 2_2, System Memory SMEM1)

The memory device 2_2 and the system memory SMEM1 are specified in the transfer destination memory specification field DSMEM, the memory device 2_1 is specified in the transfer source memory specification field SOMEM, and a write command is specified in the memory command field MCMD. Further, a desired address range is specified in the data area field DAREA and the address field Add. In this case, data of the address range specified in the data area field DAREA of the memory device 2_1 is supplied to the control circuit CNT2 in the memory device 2_2 through the second system bus SBUS2 and the third data bus 33D in the memory device 2_2 and written (copied) to the address range of the memory device 2_2 specified in the address field Add. Further, the data of the address range specified in the data area field DAREA of the memory device 2_1 is written (copied) to the address range specified in the address field Add of the system memory SMEM1 through the second system bus SBUS2. In this case, it is known that the transfer source memory specification field SOMEM is the memory device 2_1 of the master side semiconductor device 1_1, so that it is possible to omit the specification of the transfer source memory specification field SOMEM.

When the memory devices 2_2, . . . , and 2_n and the system memories SMEM1, SMEM2, . . . , and SMEMn are specified in the transfer destination memory specification field DSMEM, data of the address range specified in the data area field DAREA of the memory device 2_1 is written to all the memory devices (2_2, . . . , and 2_n) other than the memory device 2_1 and all the system memories (SMEM1, SMEM2, . . . , and SMEMn).

Specification Example (5)

Single Write 3 (System Memory
SMEM1→Memory Device 2_1)

The memory device 2_1 is specified in the transfer destination memory specification field DSMEM, the system memory SMEM1 is specified in the transfer source memory specification field SOMEM, and a read command is specified in the memory command field MCMD. Further, a desired address range is specified in the data area field DAREA and the address field Add. In this case, data of the address range specified in the data area field DAREA of the system memory SMEM1 is supplied to the control circuit CNT2 in the memory device 2_1 through the second system bus SBUS2 and the third data bus 33D in the memory device 2_1 and written (copied) to the address range of the memory device 2_1 specified in the address field Add.

Specification Example (6)

Multiple Writes 3 (System Memory
SMEM1→Memory Devices 2_1, 2_2)

The memory devices 2_1 and 2_2 are specified in the transfer destination memory specification field DSMEM, the system memory SMEM1 is specified in the transfer source memory specification field SOMEM, and a read command is specified in the memory command field MCMD. Further, a desired address range is specified in the data area field DAREA and the address field Add. In this case, data of the address range specified in the data area field DAREA of the system memory SMEM1 is supplied to the control circuit CNT2 in the memory device 2_1 through the second system bus SBUS2 and the third data bus 33D in the memory device 2_1 and written to the address range of the memory device 2_1 specified in the address field Add. Further, data of the address range of the system memory SMEM1 specified in the data area field DAREA is supplied to the control circuit CNT2 in the memory device 2_2 through the second system bus SBUS2 and the third data bus 33D in the memory device 2_2 and written (copied) to the address range of the memory device 2_2 specified in the address field Add. When all the memory devices 2_1, 2_2, . . . , and 2_$n$ are specified in the transfer destination memory specification field DSMEM, data of the address range specified in the data area field DAREA of the system memory SMEM1 is written to the address range of all the memory devices 2_1, 2_2, . . . , and 2_$n$ specified in the address field Add.

Those skilled in the art can easily understand the specification of the above format when applying the above description, so that description of all cases is omitted. By using the format as described above, it is possible to use the second system bus SBUS2 as described in the aforementioned 1) to 6). Therefore, it is possible to manage (copy and coherently manage) contents of the system memories SMEM1, SMEM2, . . . , and SMEMn and contents of the memory devices 2_1, 2_2, . . . , and 2_$n$ in the semiconductor devices 1_1, 1_2, . . . , and 1_$n$ by using the third buses and the second system bus SBUS2 without limiting use of the second buses and the first system bus SBUS1 by the data processing device.

Figure 9:
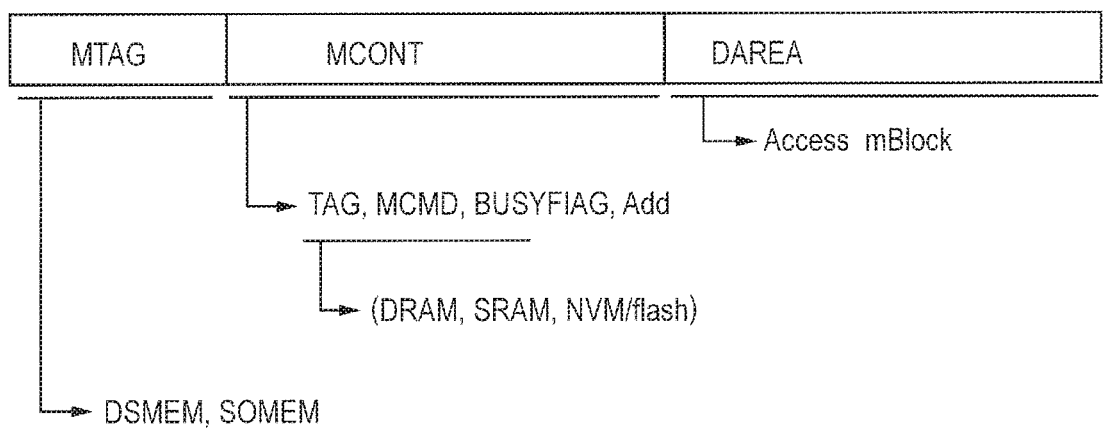
FIG. 9 is a diagram showing another example of a format of the control signals C1 and C2.

FIG. 9 is a diagram showing another example of the format of the control signals C1 and C2. The difference between the format shown in FIG. 9 and the format shown in FIG. 8 is that a memory tag information field TAG is further added to the memory function control field MCONT in the format shown in FIG. 9. In the data processing system shown in FIG. 5, when the memory devices (2_1, 2_2, . . . , 2_$n$, SMEM1, SMEM2, . . . , and SMEMn) to be used include different types of memory devices such as DRAM, SRAM, and flash memory, memory commands for each memory device are different from each other. The memory tag information field TAG is provided to be able to identify the types of memory devices. In the memory function control field MCONT, it is possible to specify the memory tag information field TAG, the memory command field MCMD, the busy channel information flag field BUSY-FLAG, and the address field Add. For example, when a plurality of types of memory devices such as a plurality of DRAMs, a plurality of SRAMs, and a plurality of flash memories NVM/Flash are mixedly used in the data processing system, TAG, MCMD, BUSYFLAG, and Add corresponding to each DRAM, TAG, MCMD, BUSYFLAG, and Add corresponding to each SRAM, and TAG, MCMD, BUSYFLAG, and Add corresponding to each flash memory are specified in the memory function control field MCONT. Further, when each of the memory devices (2_1, 2_2, . . . , and 2_$n$) is, for example, a stacked memory where a plurality of DRAM chips, a plurality of chips, a plurality of flash memory chips, and the like are mixedly mounted, in the same manner, TAG, MCMD, BUSYFLAG, and Add corresponding to each DRAM chip, TAG, MCMD, BUSYFLAG, and Add corresponding to each SRAM chip, and TAG, MCMD, BUSYFLAG, and Add corresponding to each flash memory chip can be specified in the memory function control field MCONT.

Thereby, even in a data processing system including different types of memory devices, it is possible to manage contents of memory devices using the second system bus SBUS2.

Modified Example 1 of Memory Device

Figure 10:
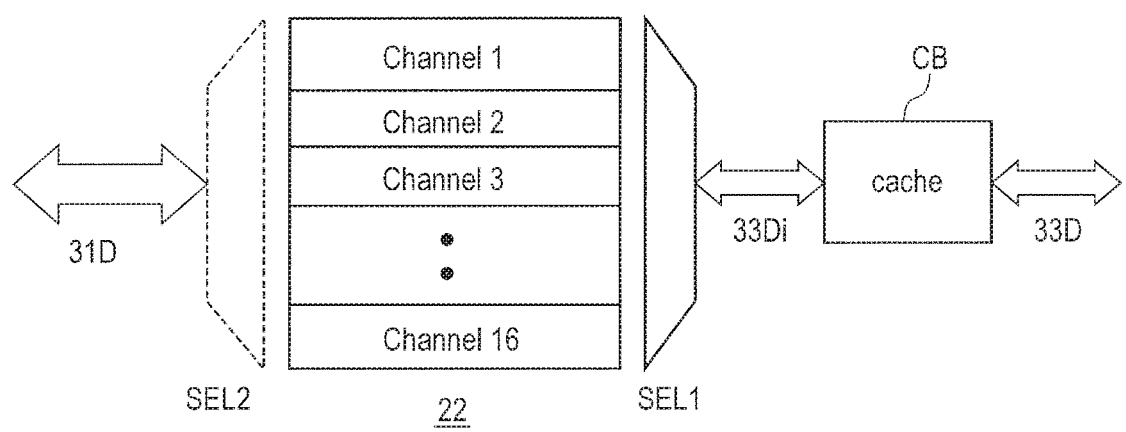
FIG. 10 is a diagram showing a modified example 1 of the memory device of FIG. 7.

FIG. 10 is a diagram showing a modified example 1 of the memory device of FIG. 7. FIG. 10 shows a configuration example of a memory device 22 portion of FIG. 7 in a case in which a cache memory cache is provided as the circuit block CB shown in FIG. 6. The other configuration is the same as that of FIG. 7. The cache memory cache is provided between an internal data bus 33Di coupled to the selection circuit SEL1 and the third data bus 33D. The cache memory cache is provided to enable block transfer as data transfer using the second system bus SBUS2 between memory devices, for example, data transfer between the memory device 2_1 and the system memory SMEM2. Thereby, it is possible to facilitate a data management program.

Modified Example 2 of Memory Device

FIG. 11 is a diagram showing a modified example 2 of the memory device of FIG. 7. While FIG. 10 shows a configuration example where the cache memory cache is provided as the circuit block CB shown in FIG. 6, FIG. 11 shows a configuration example where an arithmetic circuit AC is provided as the circuit block CB. The other configuration is the same as those of FIGS. 7 and 10. The arithmetic circuit AC that can perform simple arithmetic operations is provided between the internal data bus 33Di coupled to the selection circuit SEL1 and the third data bus 33D. By providing the arithmetic circuit AC, it is possible to perform a desired arithmetic operation on data inputted through the second system bus SBUS2 and the third data bus 33D so that the data becomes optimal for use in the data processing device. For example, by providing the arithmetic circuit AC in a data processing device that receives analog information from a sensor and directly performs an arithmetic operation on the analog information, the data processing device can convert the analog information into desired digital information by performing a desired arithmetic operation on the analog information. Thereby, it is possible to improve efficiency of data processing in the data processing device. The arithmetic circuit AC can be a digital arithmetic circuit a programmable arithmetic circuit, a digital signal processor, or the like.

FIG. 11 also shows an example of a channel assignment. In FIG. 11, the channels 1 and 3 to 16 indicate channels assigned for foreground processing of the data processing device 3_1. On the other hand, the channel 2 indicates a channel assigned for memory management. Here, the channel 2 can be regarded as a channel used for processing in the background with respect to the foreground processing. When the memory management ends, the channel 2 assigned to the background processing can be changed to another channel, for example, the channel 1 by control of the data processing device 3_1. The channel 2 can be assigned as a channel of foreground processing. The data processing device 3_1 has a channel assignment function in its operating system (OS). The channel assignment can be performed when the data processing device 3_1 transmits channel request information from the fourth bus 34 to the second control circuit CNT2. In this case, the priority of the channel request information transmitted from the data processing device 3_1 is required to be set to a high level when channel arbitration is performed.

FIG. 12 is a diagram showing another assignment example of the channel assignment of FIG. 1n FIG. 12, the channels 1 to 3 are assigned to the background processing and the channels 4 to 16 are assigned to the foreground processing. The other configuration is the same as those of FIGS. 7 and 11. This configuration can be used for processing such as, for example, writing the same data to the channels 1 to 3. When assigning a plurality of channels such as the channels 1 to 3 to the background processing, it is possible to perform the assignment by, for example, newly adding a channel assignment specification field to the format of FIG. 8 and making it possible to specify a plurality of channels into the channel assignment specification field.

Modified Example 3 of Memory Device

Figure 13:
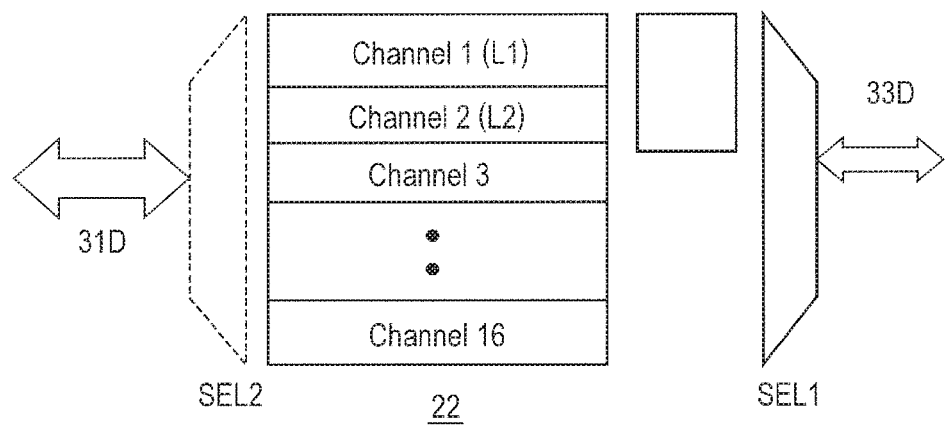
FIG. 13 is a diagram showing a modified example 3 of the memory device of FIG. 7.

FIG. 13 is a diagram showing a modified example 3 of the memory device of FIG. 7. FIG. 13 shows a schematic configuration example when realizing the primary cache memory L1 and the secondary cache memory L2 shown in FIG. 3 by the channel 1 (L1) and the channel 2 (L2) of the memory device 2_1. A cache control circuit CACHE_CONT of the primary cache memory (the channel 1 (L1)) and the secondary cache memory (the channel 2 (L2)) is drawn so as to be arranged between the selection circuit SEL1 and the channels 1 (L1) and 2 (L2). It is possible to perform management of storage contents of the primary cache memory (the channel 1 (L1)) and the secondary cache memory (the channel 2 (L2)) by using the second system bus SBUS2 and the third data bus 33D.

Modified Example 1 of Data Processing System

Figure 14:
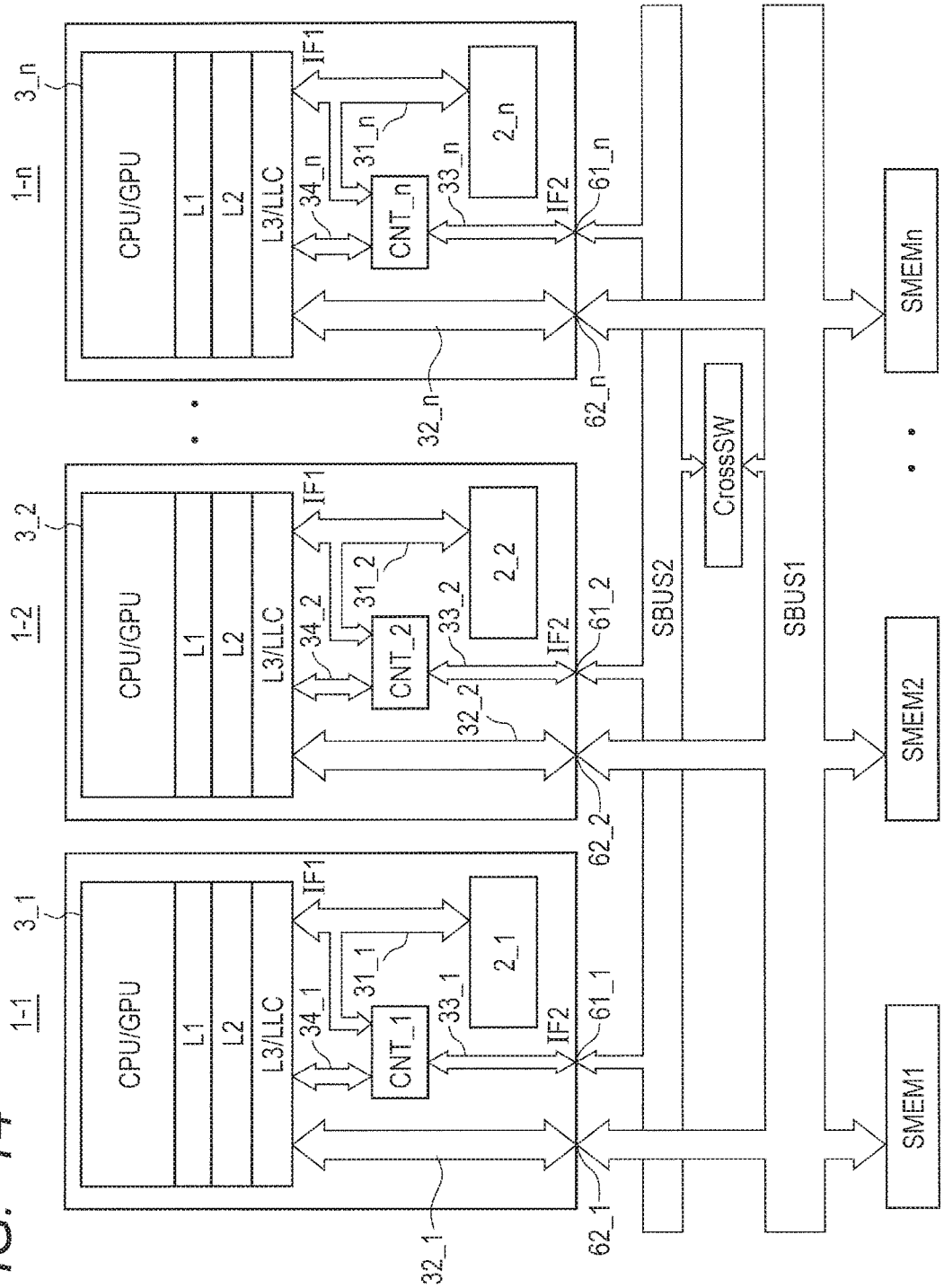
FIG. 14 is a diagram showing a modified example 1 of the data processing system of FIG. 5.

FIG. 14 is a diagram showing a modified example 1 of the data processing system FIG. 5. In FIG. 5, the first system bus SBUS1 and the second system bus SBUS2 are coupled to the system memories SMEM1, SMEM2, . . . , SMEMn, which are two-port memories. In FIG. 14, each of the system memories SMEM1, SMEM2, . . . , and SDEMn is a single port memory having one input/output port, and the input/output port is coupled to the first system bus SBUS1 Therefore, in this example, a crossbar switch CrossSW is provided between the first system bus SBUS1 and the second system bus SBUS2, so that the system memories SMEM1, SMEM2, . . . , and SMEMn can be coupled with the second system bus SBUS2. The other configuration is the same as that of FIG. 5.

Also in the configuration described above, it is possible to manage contents of the system memories SMEM1, SMEM2, . . . , and SMEMn and contents of the memory devices 2_1, 2_2, . . . , and 2_n in the semiconductor devices 1_1, 1_2, . . . , and 1_n by using the second system bus SBUS2 without using the first system bus SBUS1.

Second Embodiment

Figure 15:
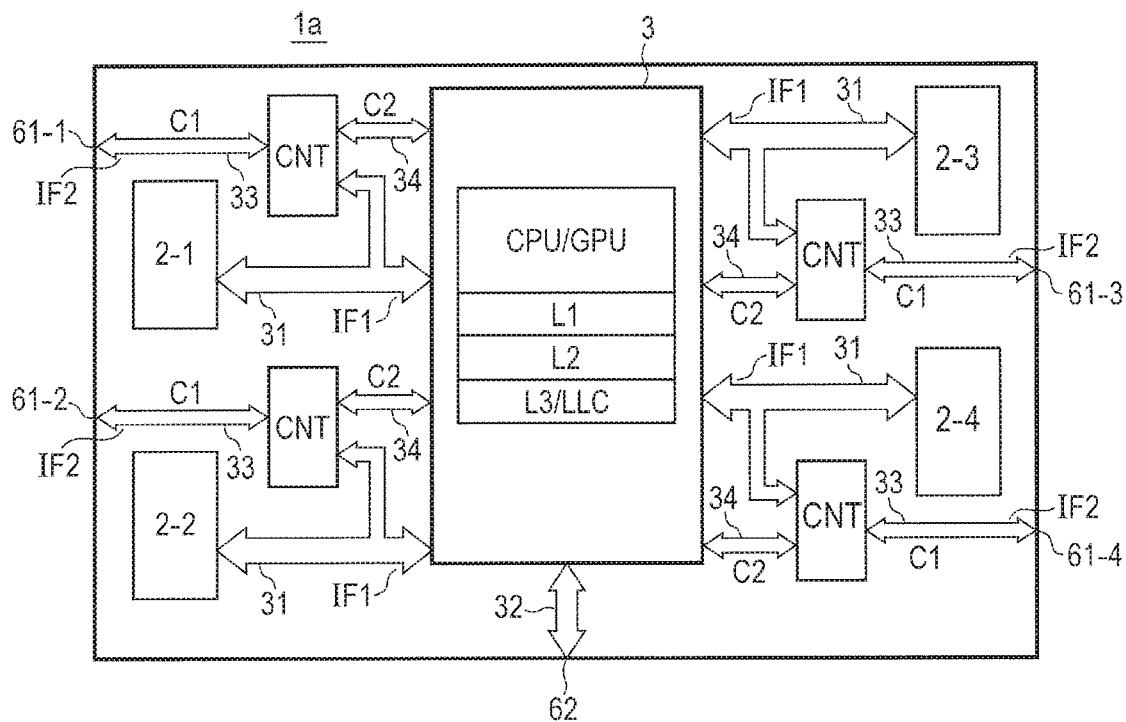
FIG. 15 is a conceptual block diagram of a semiconductor device according to a second embodiment.

FIG. 15 is a conceptual block diagram of a semiconductor device according to a second embodiment. While the semiconductor device 1 of FIG. 3 is provided with one data processing device 3 and one memory device 2, the semiconductor device 1a of FIG. 15 is provided with one data processing device 3 and four memory devices (a first memory device, a second memory device, a third memory device, and a fourth memory device) 2-1, 2-2, 2-3, and 2-4. Accordingly, the semiconductor device 1a of FIG. 15 is provided with four first external terminals 61-1, 61-2, 61-3, and 61-4, which are second interface units IF2. In the same manner as in FIG. 3, the first bus 31, the third bus 33, the fourth bus 34, and the control circuit CNT are provided for each of the memory devices 2-1, 2-2, 2-3, and 2-4. The other configuration is the same as that of FIG. 3 of the first embodiment. The first bus 31, the third bus 33, the fourth bus 34, and the control circuit CNT in FIG. 15 are the same as those in FIG. 6, so that their description is omitted.

Figure 16:
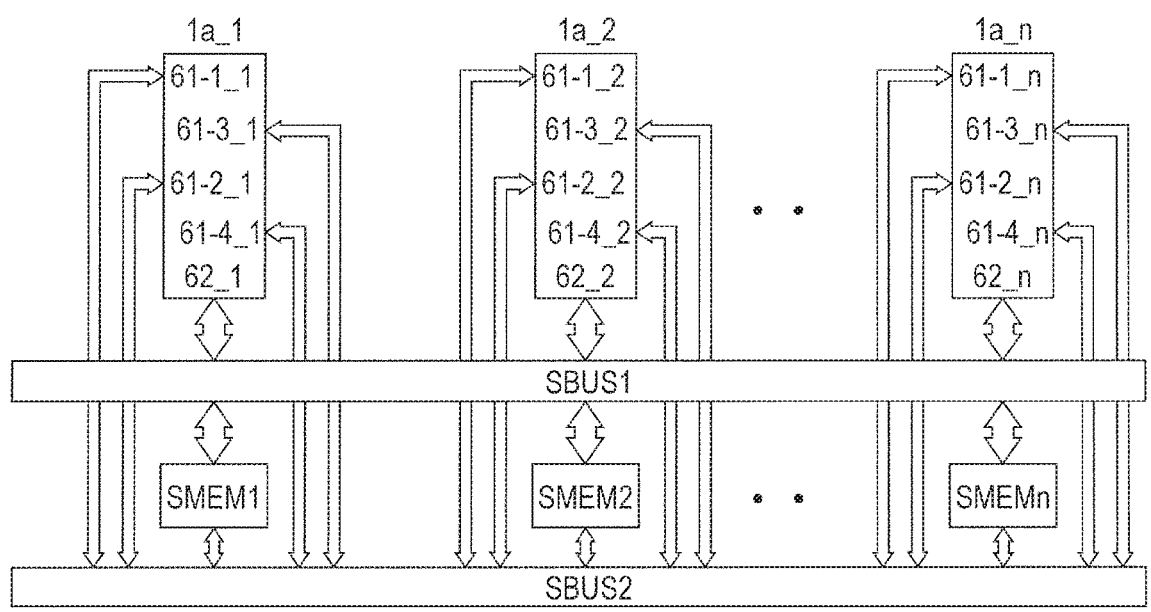
FIG. 16 is a configuration diagram of a data processing system according to the semiconductor device of FIG. 15.

FIG. 16 is a configuration diagram of a data processing system according to the semiconductor device of FIG. 15. The data processing system of FIG. 16 includes a plurality of semiconductor devices 1a_1, 1a_2, . . . , and 1a_n. Each of the semiconductor devices 1a_1, 1a_2, . . . , 1a_n corresponds to the semiconductor device 1a of FIG. 15. The semiconductor device 1a_1 has a plurality of first external terminals 61-1_1, 61-2_1, 61-3_1, and 61-4_1 coupled to the second system bus SBUS2. The semiconductor device 1a_1 also has a second external terminal 62-1 coupled to the first system bus SBUS1. Similarly, the semiconductor devices 1a_2, . . . , and 1a_n have a plurality of first external terminals (61-1_2, 61-2_2 61-3_2, and 61-4_2, . . . , and 61-1_n, 61-2_n 61-3_n, and 61-4_n) coupled to the second system bus SBUS2. Further, similarly, the semiconductor devices 1a_2, . . . , and 1a_n have second external terminals (62_2, . . . , and 62_n) coupled to the first system bus SBUS1. In the same manner as in FIG. 5, each of the system memories SMEM1, SMEM2, . . . , and SMEMn is a two-port memory. One of the two ports is coupled to the first system bus SBUS1 and the other port is coupled to the second system bus SBUS2.

Figure 17:
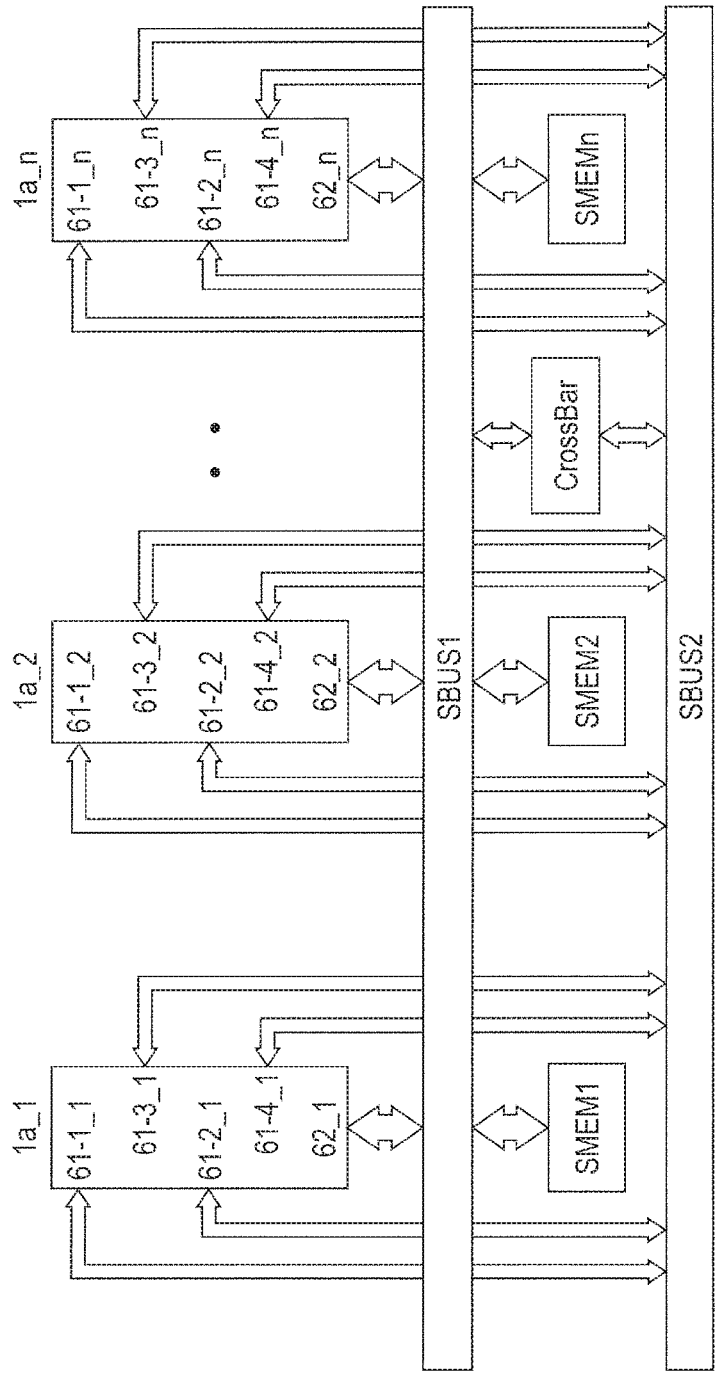
FIG. 17 is a configuration diagram of another data processing system according to the semiconductor device of FIG. 15.

FIG. 17 is a configuration diagram of another data processing system according to the semiconductor device of FIG. 15. A difference from the data processing system of FIG. 16 is that the input/output port of each of the system memories SMEM1, SMEM2, . . . , and SMEMn is a single port and a crossbar switch CrossBar is provided between the first system bus SBUS1 and the second system bus SBUS2. In other words, FIG. 17 shows a data processing system in which a plurality of semiconductor devices 1a of FIG. 15 are used in the data processing system of FIG. 14. The other configuration is the same as that of FIG. 16.

Also in the configuration of the second embodiment described above, it is possible to manage contents of the system memories SMEM1, SMEM2, . . . , and SMEMn and contents of the memory devices 2_1, 2_2, . . . , and 2_n in the semiconductor devices 1_1, 1_2, . . . , and 1_n by using the second system bus SBUS2 without using the first system bus SBUS1.

Third Embodiment

Figure 18:
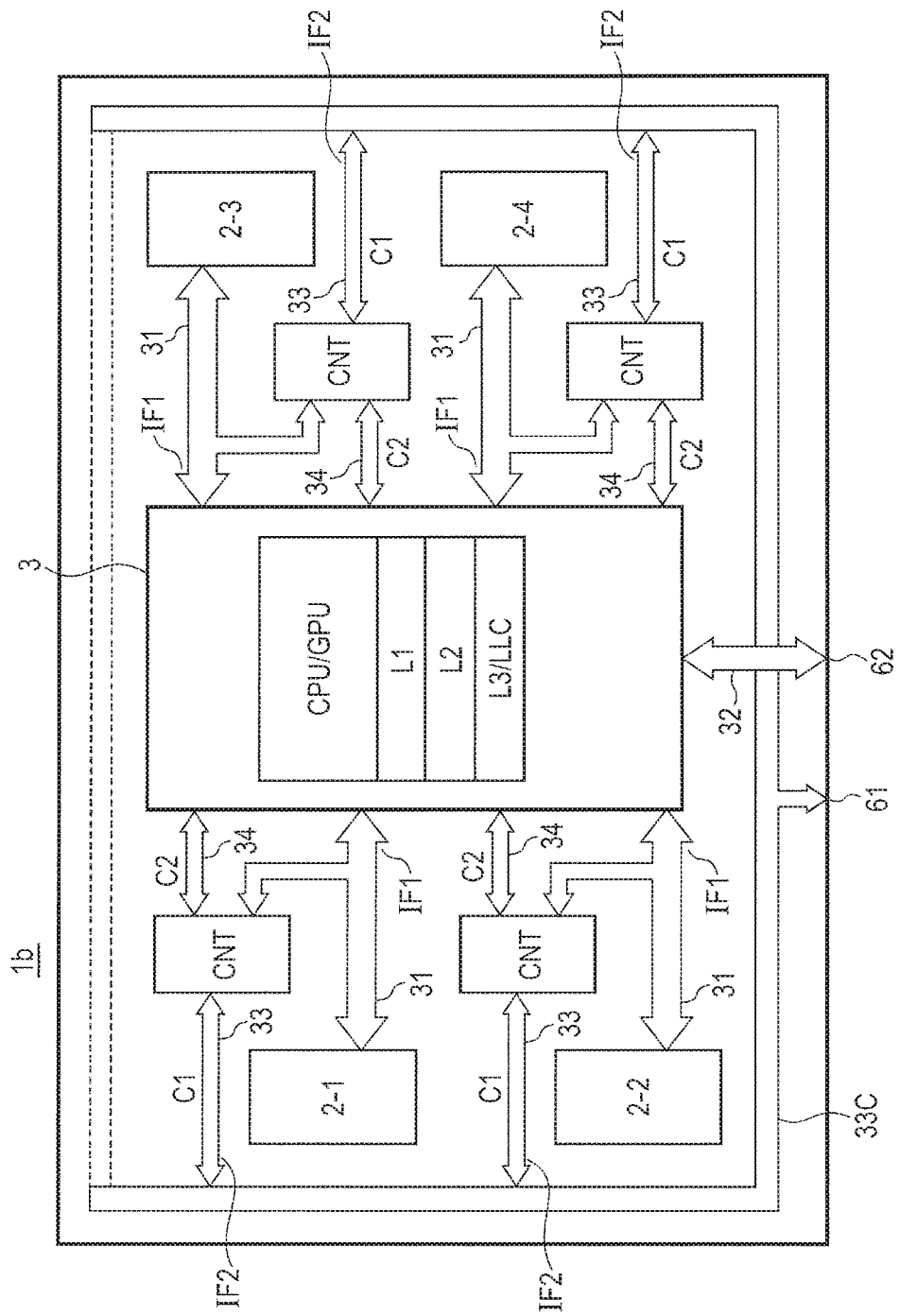
FIG. 18 is a block diagram of a modified example of a semiconductor device according to a third embodiment.

FIG. 18 is a block diagram of a modified example of a semiconductor device according to a third embodiment. A difference between the semiconductor device 1a of FIG. 15 and a semiconductor device 1b of FIG. 18 is that although the semiconductor device 1b of FIG. 18 is provided with four memory devices (a first memory device, a second memory device, a third memory device, and a fourth memory device) 2-1, 2-2, 2-3, and 2-4, the semiconductor device 1b is provided with only one first external terminal 61. Specifically, although the first bus 31, the third bus 33, the fourth bus 34, and the control circuit CNT are provided for each of the four memory devices 2-1, 2-2, 2-3, and 2-4 in the same manner as in FIG. 15, the third buses 33 of the four memory devices are coupled to a common third bus 330 and the common third bus 33C is coupled to the one first external, terminal 61. The common third bus 33C may be provided in a ring shape in the semiconductor device 1b as shown by dashed lines in an upper portion of FIG. 18.

Figure 19:
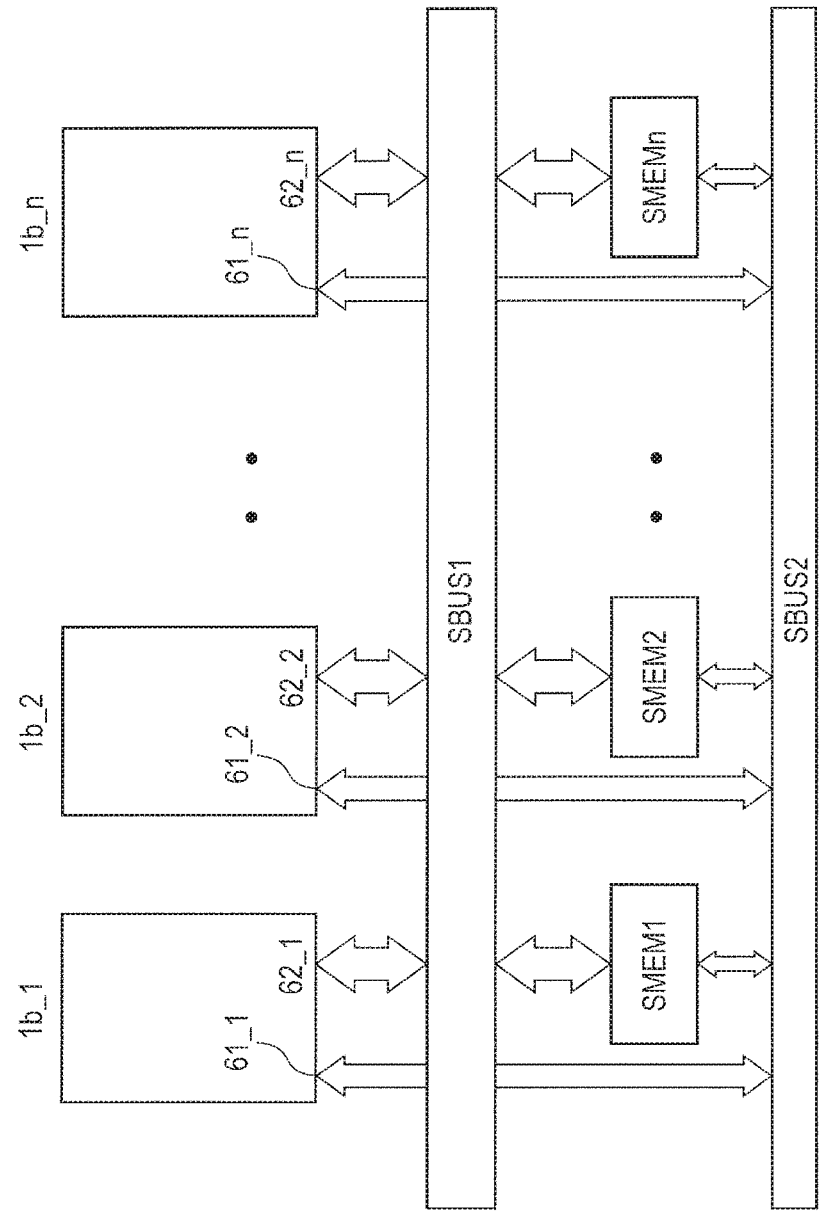
FIG. 19 is a configuration diagram of a data processing system according to the semiconductor device of FIG. 18.

FIG. 19 is a configuration diagram of a data processing system according to the semiconductor device of FIG. 18. The data processing system of FIG. 19 includes a plurality of semiconductor devices 1b_1, 1b_2, . . . , and 1b_n. Each of the semiconductor devices 1b_1, 1b_2, . . . , and 1b_n corresponds to the semiconductor device 1b of FIG. 18. The semiconductor device 1b_1 has a first external terminal 61_1 coupled to the second system bus SEUS2. The semiconductor device 1b_1 also has a second external terminal 62_1 coupled to the first system bus SBUS1. Similarly, the semiconductor devices 1b_2, . . . , and 1b_n also have a plurality of first external terminals (61_2, . . . , and 61_n) coupled to the second system bus SBUS2. Further, similarly, the semiconductor devices 1b_2, . . . , and 1b_n have second external terminals (62_2, . . . , and 62_n) coupled to the first system bus SBUS1. In the same manner as in FIG. 5, each of the system memories SMEM1, SMEM2, . . . , and SMEMn is a two-port memory. One of the two ports is coupled to the first system bus SBUS1 and the other port is coupled to the second system bus SBUS2.

Figure 20:
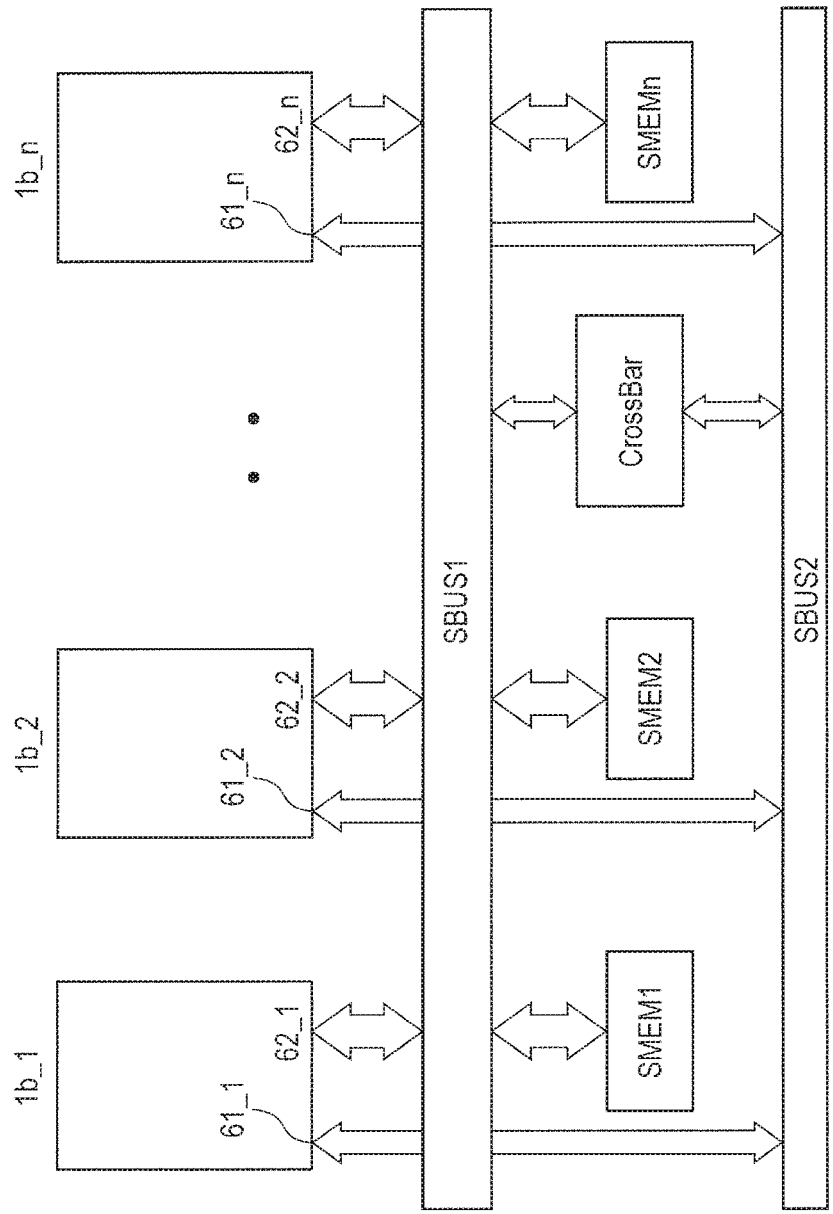
FIG. 20 is a configuration diagram of another data processing system according to the semiconductor device of FIG. 18.

FIG. 20 is a configuration diagram of another data processing system according to the semiconductor device of FIG. 18. A difference from the data processing system of FIG. 19 is that the input/output port of each of the system memories SMEM1, SMEM2, . . . , and SMEMn is a single port and a crossbar switch CrossBar is provided between the first system bus SBUS1 and the second system bus SBUS2. In other words, FIG. 20 shows a data processing system in which a plurality of semiconductor devices 1b of FIG. 18 are used in the data processing system of FIG. 14. The other configuration is the same as that of FIG. 19.

Also in the configuration of the third embodiment described above, it is possible to manage contents of the system memories SMEM1, SMEM2, . . . , and SMEMn and contents of the memory devices 2_1, 2_2, . . . , and 2_n in the semiconductor devices 1_1, 1_2, . . . , and 1_n by using the second system bus SBUS2 without using the first system bus SBUS1.

Fourth Embodiment

Figure 21:
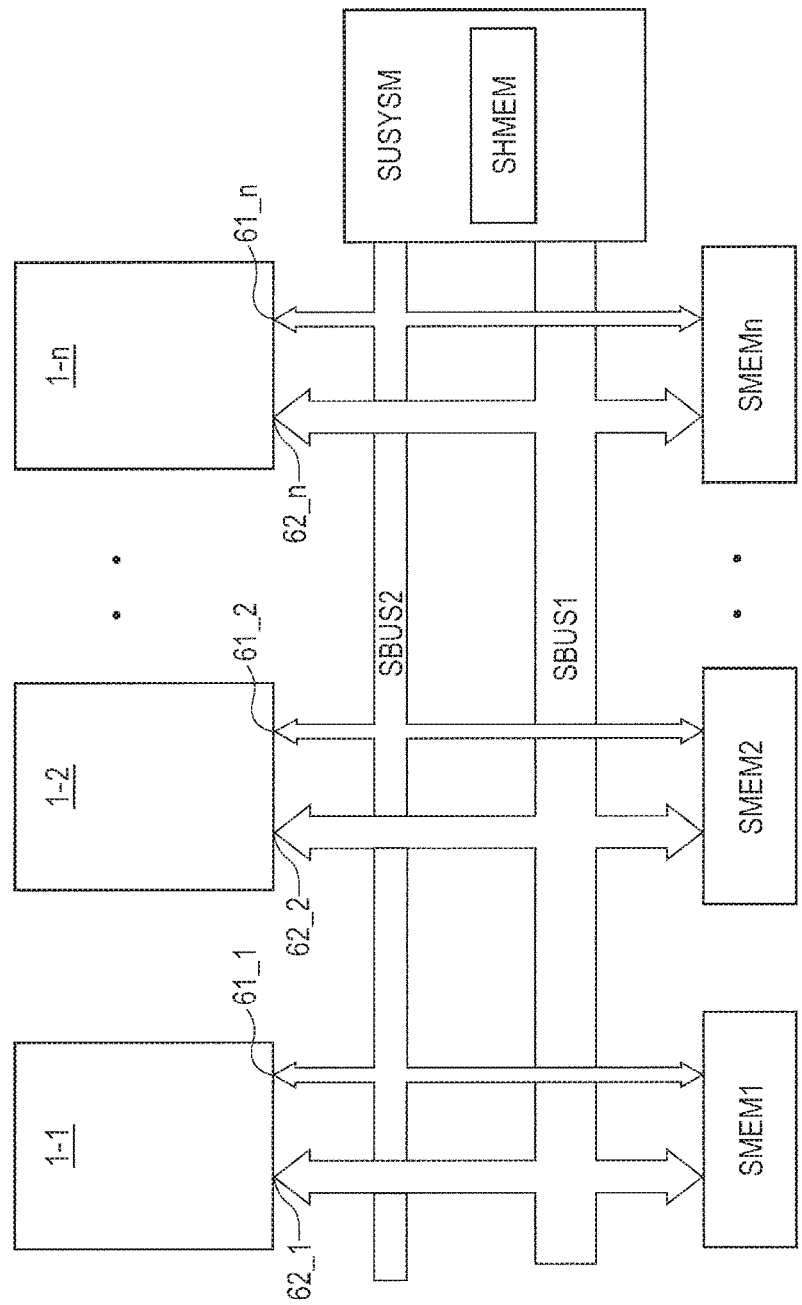
FIG. 21 is a configuration diagram of a data processing system according to a fourth embodiment.

FIG. 21 is a configuration diagram of a data processing system according to a fourth embodiment. FIG. 21 shows a configuration where a sub-system memory SUSYSM coupled to the first system bus SBUS1 and the second system bus SBUS2 is newly provided in the data processing system of FIG. 5. The sub-system memory SUSYSM is provided to add one layer of a shared memory for the second system bus SBUS2 and integrally manage data that is required to be shared in common. The sub-system memory SUSYSM overviews the first system bus SBUS1 as a master, virtualizes parallelized data processing devices 1_1, 1_2, . . . , and 1_n, and controls a data plane. The sub-system memory SUSYSM includes a shared memory SHMEM, and data that is required to be shared in common is stored in the shared memory SEMEM. The subsystem memory SUSYSM has the shared memory SHMEM that shares memory spaces of storage devices 2_1, 2_2, . . . , and 2_n of a multi-cored data processing system as a system pool and a controller that controls the shared memory SHMEM.

By the configuration described above, in the multi-cored data processing system, it is possible to perform control where storage contents in the storage devices 2_1, 2_2, . . . , and 2_n are integrated in the entire data system. Further, it is possible to distribute loads of data transfer and data processing by adding one layer of the shared memory to hierarchize the shared memory while performing control in the data processing device.

MODIFIED EXAMPLES

Hereinafter, modified examples according to the present invention will be described.

Hereinafter, a portion where the control circuits CNT (CNT_1, CNT_2, . . . , and CNT_n) described in the first embodiment are provided will be described as the modified examples. The circuit block CB described in FIG. 6 (the cache memory cache in FIG. 10, the arithmetic circuit in FIG. 11) may be included in the control circuit CNT.

Modified Example 1

Figure 22A:
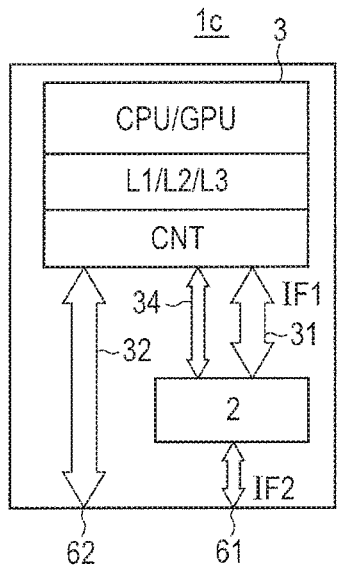
FIGS. 22A-22B are diagrams showing a configuration example of a semiconductor device according to a modified example 1.
Figure 22B:
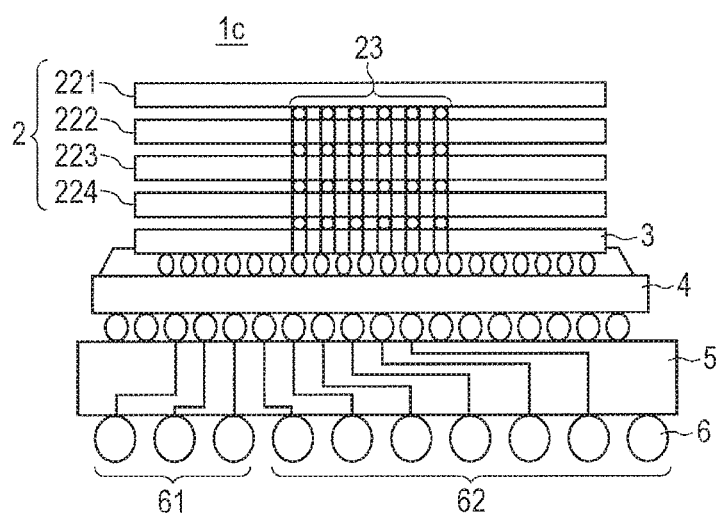

FIGS. 22A-22B are diagrams showing a configuration example of a semiconductor device according to a modified example 1. In FIG. 6 of the first embodiment, an example is shown in which a configuration of the control circuit CNT is provided in the base chip 21. In a semiconductor device 1c shown in FIG. 22A, the control circuit CNT is provided in the data processing device 3 instead of the base chip 21 of the memory device 2. In this case, for example, it is preferable that a memory controller included in the data processing device 3 includes function of the control circuit CNT. FIG. 22B is a configuration in which the memory device 2 is mounted on an upper surface of the data processing device 3, that is, a conceptual cross-sectional view of a three-dimensionally mounted semiconductor device 1c.

In such a configuration, it is also possible to obtain the same effect as that of the first embodiment.

Modified Example 2

Figure 23:
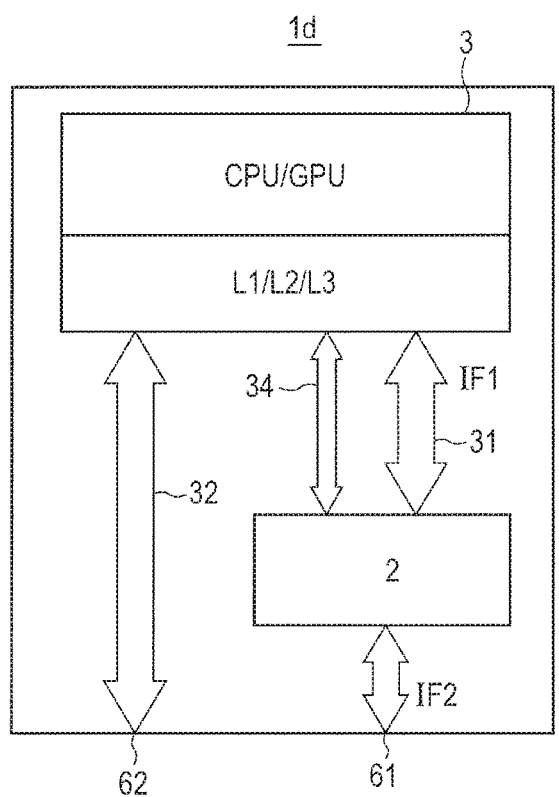
FIG. 23 is a diagram showing a configuration example of a semiconductor device according to a modified example 2.

FIG. 23 is a diagram showing a configuration example of a semiconductor device according to a modified example 2.

Figure 24:
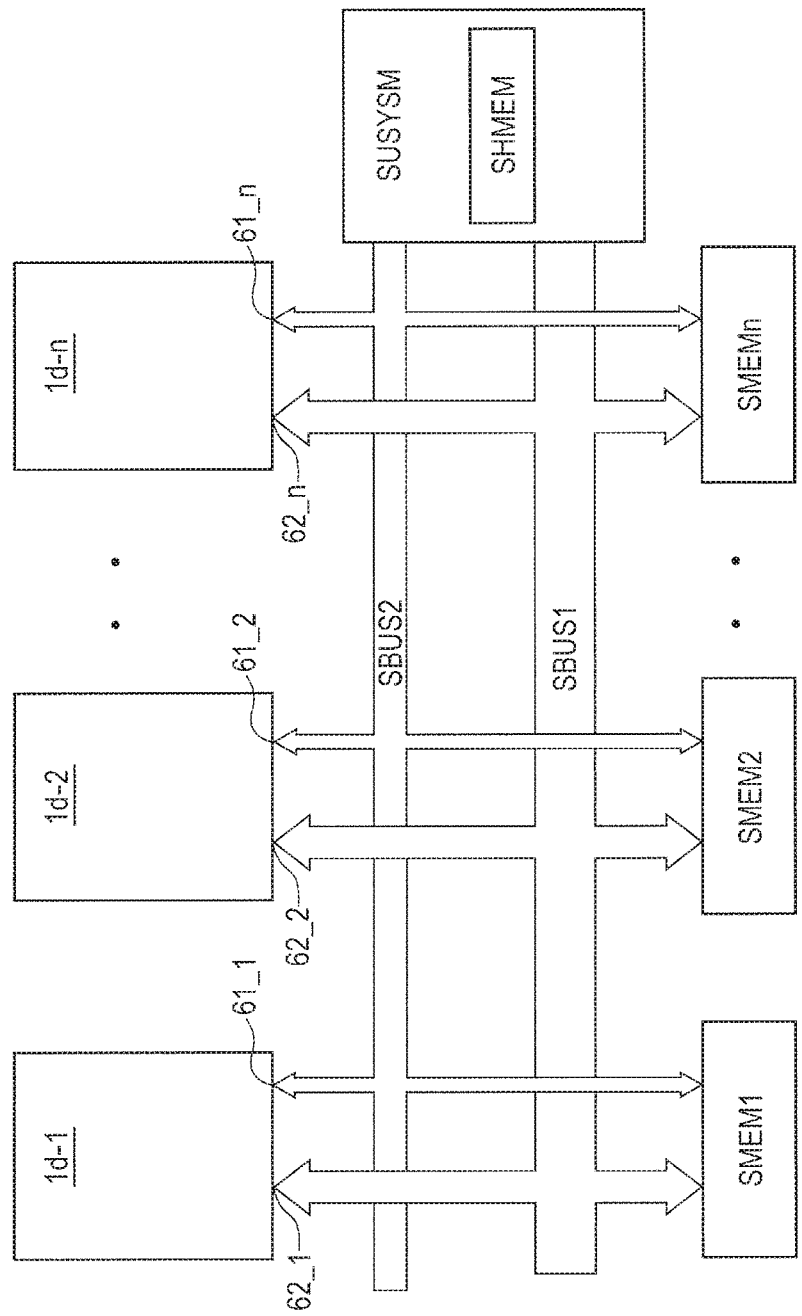
FIG. 24 is a diagram showing a configuration example of a data processing system according to the modified example 2.

FIG. 24 is a diagram showing a configuration example of a data processing system according to the modified example 2. In the modified example 2, as shown in FIG. 24, the control circuit CNT is provided to the sub-system memory SUSYSM described in FIG. 21. In this case, each of semiconductor devices $1d\_1, 1d\_2, \ldots,$ and $1d\_n$ shown in FIG. 24 is a data processing device $1d$ having a configuration as shown in FIG. 23. In the data processing device $1d$ shown in FIG. 23, a configuration of the control circuit CNT in the base chip 21 is not provided in the data processing device $1d$. Instead, the control circuit CNT is provided to the sub-system memory SUSYSM. In some cases, a circuit portion including the second control circuit CNT2 and the selection circuit SEL1 may be provided to the sub-system memory SUSYSM.

In such a configuration, it is also possible to obtain the same effect as that of the first embodiment;

Modified Example 3

Figure 25:
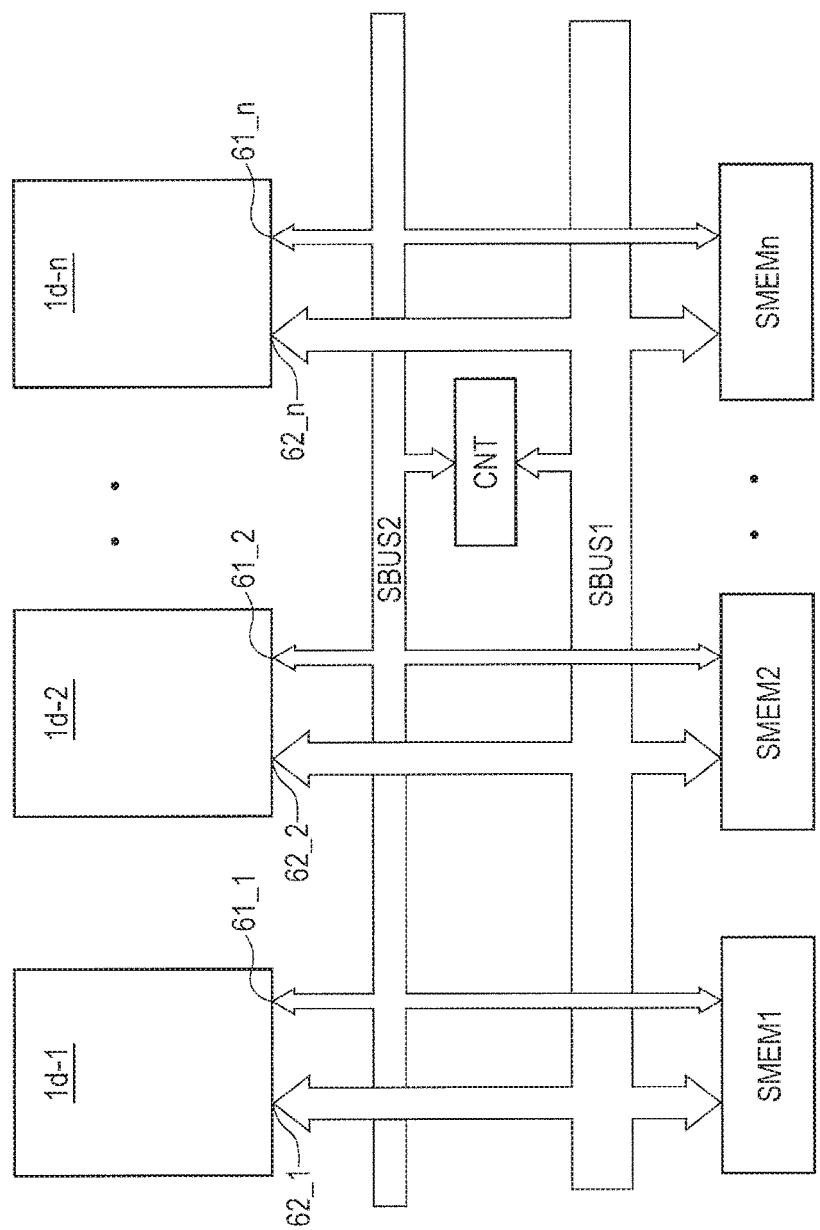
FIG. 25 is a diagram showing a configuration example of a data processing system according to the modified example 3.

FIG. 25 is a diagram showing a configuration example of a data processing system according to a modified example 3. In the modified example 2 of FIG. 24, the control circuit CNT is provided to the sub-system memory SUSYSM. In the modified example 3, the sub-system memory SUSYSM including the control circuit CNT is not provided. Instead, the control circuit CNT is coupled between the first system bus SBUS1 and the second system bus SBUS2. As the data processing devices $1d\_1, 1d\_2, \ldots,$ and $1d\_n$, it is possible to use the data processing device $1d$ having the configuration shown in FIG. 23 described in the modified example 2. In some cases, a circuit portion including the second control circuit CNT2 and the selection circuit SEL1 may be provided between the first system bus SBUS1 and the second system bus SBUS2.

In such a configuration, it is also possible to obtain the same effect as that of the first embodiment.

Modified Example 4

Figure 26:
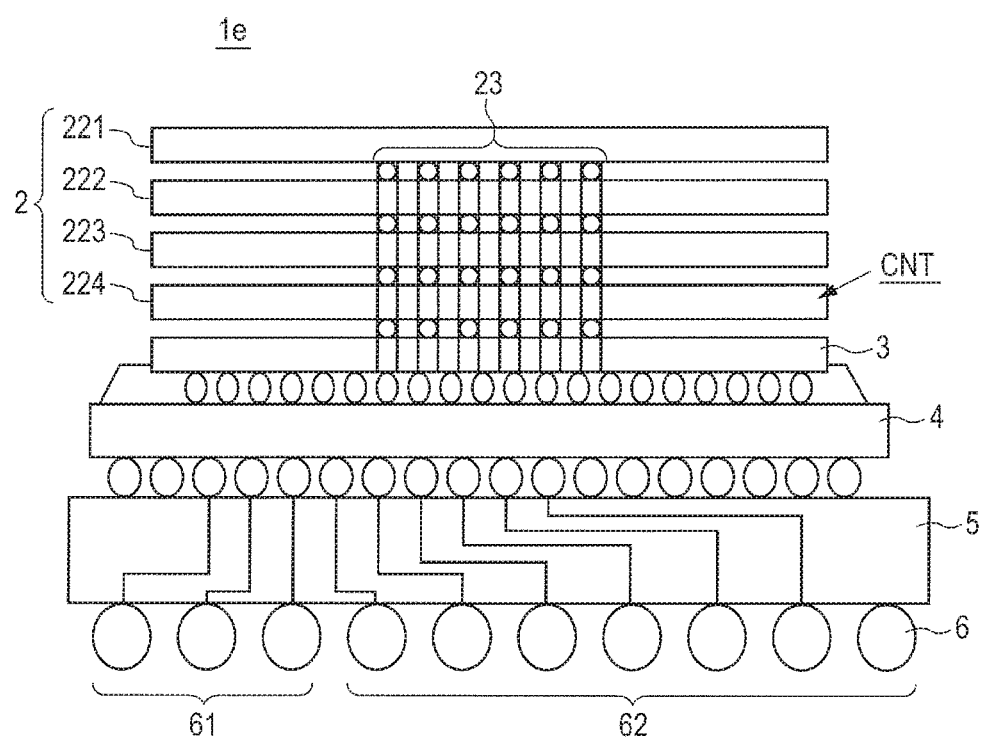
FIG. 26 is a diagram showing a configuration example of a semiconductor device according to a modified example 4.

FIG. 26 is a diagram showing a configuration example of a semiconductor device according to a modified example 4. FIG. 26 is a configuration in which the memory device 2 is mounted on an upper surface of the data processing device 3, that is, a conceptual cross-sectional view of a three-dimensionally mounted semiconductor device $1e$. In the modified example 1 of FIG. 22A-22B, an example where the control circuit CNT is provided in the data processing device 3 is shown. In this example, the control circuit CNT is provided in, for example, a memory chip 224. The control circuit CNT may be provided in any one of the memory chips 221, 222, 223, and 224. Alternatively, the control circuits CNT may be dispersively provided to the memory chips 221, 222, 223, and 224.

In such a configuration, it is also possible to obtain the same effect as that of the first embodiment.

While the invention made by the inventors has been specifically described based on the embodiments, it is needless to say that the present invention is not limited to the embodiments and may be variously modified.

What is claimed is:

1. A semiconductor device, comprising:
   a data processing device;
   a memory device;
   a control circuit having a management function of the memory device;
   a first substrate coupled to the data processing device and the memory device;
   a second substrate coupled to the first substrate and used as a circuit substrate of a package covering the data processing device and the memory device, the second substrate comprising a first external terminal and a second external terminal;
   a first bus coupled between the data processing device and the memory device;
   a second bus coupled between the data processing device and the second external terminal; and
   a third bus coupled between the control circuit and the first external terminal,
   wherein the memory device comprises 1) a first access path to perform reading and writing through the first bus such that reading and writing from the data processing device are performed without going through the control circuit, and 2) a second access path to perform reading and writing through the third bus, the control circuit, and the first bus such that reading and writing from the first external terminal are performed through the control circuit but without going through the data processing device.

2. The semiconductor device according to claim 1, wherein the data processing device includes a central processing unit and a cache memory.

3. The semiconductor device according to claim 2, wherein the memory device includes:
   a base chip including a first interface unit and a second interface unit: and
   a semiconductor memory mounted over the base chip,
   wherein the control circuit is provided in the base chip,
   wherein the first bus is provided between the first interface unit and the data processing device, and
   wherein the third bus is provided between the second interface unit and the first external terminal.

4. The semiconductor device according to claim 3, wherein the semiconductor memory includes a plurality of stacked semiconductor chips.

5. The semiconductor device according to claim 3,
   wherein the memory device includes a first memory device, a second memory device, a third memory device, and a fourth memory device, and
   wherein the first external terminal includes a first terminal coupled to the first memory device, a second terminal coupled to the second memory device, a third terminal coupled to the third memory device, and a fourth terminal coupled to the fourth memory device.

6. The semiconductor device according to claim 3, wherein the memory device includes a first memory device, a second memory device, a third memory device, and a fourth memory device, and
   wherein each of the first memory device, the second memory device, the third memory device, and the fourth memory device is coupled to the first external terminal through the third bus.

7. The semiconductor device according to claim 1,
   wherein the memory device includes a base chip that includes a first interface unit and a second interface unit,
   wherein the control circuit is provided in the base chip,
   wherein the first bus is provided between the first interface unit and the data processing device, and
   wherein the third bus is provided between the second interface unit and the first external terminal.

8. A data processing system, comprising:
a system bus;
an auxiliary bus;
a system memory coupled to the system bus and the auxiliary bus;
a plurality of semiconductor devices which are coupled to the system bus and the auxiliary bus and each of which comprises:
a data processing device;
a memory device;
a control circuit having a management function of the memory device;
a first substrate coupled to the data processing device and the memory device;
a second substrate coupled to the first substrate and used as a circuit substrate of a package covering the data processing device and the memory device, the second substrate comprising a first external terminal and a second external terminal;
a first bus coupled between the data processing device and the memory device;
a second bus coupled between the data processing device and the second external terminal; and
a third bus coupled between a control circuit and the first external terminal,
wherein the memory device comprises 1) a first access path to perform reading and writing through the first bus such that reading and writing from the data processing device are performed without going through the control circuit and 2) a second access path to perform reading and writing through the third bus, the control circuit, and the first bus such that reading and writing from the first external terminal are performed through the control circuit but without going through the data processing device,
wherein the first external terminal of each of the plurality of semiconductor devices is coupled to an auxiliary bus, and
wherein the second external terminal of each of the plurality of semiconductor devices is coupled to a system bus.

9. The data processing system according to claim 8, wherein the control circuit is provided to each of the semiconductor devices.

10. The data processing system according to claim 9, wherein the control circuit is coupled to the first bus and the third bus.

11. The data processing system according to claim 10, wherein the memory device includes:
a base chip; and
a semiconductor memory mounted over the base chip, and
wherein the control circuit is provided in the base chip.

12. The data processing system according to claim 11, wherein the semiconductor memory includes a plurality of stacked semiconductor chips.

13. The data processing system according to claim 11,
wherein the memory device includes a first memory device, a second memory device, a third memory device, and a fourth memory device, and
wherein the first external terminal includes a first terminal coupled to the first memory device, a second terminal coupled to the second memory device, a third terminal coupled to the third memory device, and a fourth terminal coupled to the fourth memory device.

14. The data processing system according to claim 11,
wherein the memory device includes a first memory device, a second memory device, a third memory device, and a fourth memory device, and
wherein each of the first memory device, the second memory device, the third memory device, and the fourth memory device is coupled to the first external terminal through the third bus.

15. The data processing system according to claim 8, wherein the control circuit is provided between the system bus and the auxiliary bus.

16. The data processing system according to claim 8, further comprising: a sub-system memory coupled between the system bus and the auxiliary bus.

17. The data processing system according to claim 16, wherein the control circuit is provided in the sub-system memory.

18. The data processing system according to claim 8, wherein the memory device includes a base chip that includes a first interface unit and a second interface unit.

19. The data processing system according to claim 18, wherein the first bus is provided between the first interface unit and the data processing device.

20. The data processing system according to claim 19, wherein the third bus is provided between the second interface unit and the first external terminal.

* * * * *